(12) United States Patent
Woo et al.

(10) Patent No.: US 12,495,685 B2
(45) Date of Patent: Dec. 9, 2025

(54) DISPLAY DEVICE AND ELECTRONIC DEVICE HAVING THE SAME

(71) Applicant: Samsung Display Co., Ltd., Yongin-si (KR)

(72) Inventors: Minwoo Woo, Seoul (KR); Jinsung An, Gwacheon-si (KR); Seunghyun Lee, Asan-si (KR); Wangwoo Lee, Osan-si (KR); Jiseon Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 670 days.

(21) Appl. No.: 17/710,017

(22) Filed: Mar. 31, 2022

(65) Prior Publication Data
US 2022/0392991 A1    Dec. 8, 2022

(30) Foreign Application Priority Data
Jun. 8, 2021    (KR) .................. 10-2021-0074357

(51) Int. Cl.
*H10K 59/131*    (2023.01)
*G09G 3/32*    (2016.01)
(Continued)

(52) U.S. Cl.
CPC ............. *H10K 59/131* (2023.02); *G09G 3/32* (2013.01); *G09G 3/3233* (2013.01);
(Continued)

(58) Field of Classification Search
CPC ............. H10K 59/1201; H10K 59/131; H10K 71/233; H10K 71/80; H10K 71/851; H10K 77/00; H10K 77/111; H10K 2102/311; H10K 59/1213; H10K 59/13–1315; H10K 59/60; H10K 59/65; H10K 50/865; H10K 59/121; H10K 59/122; H10K 59/123; H10K 59/126; H10K 59/35–353; H10K 59/88; H10K 59/84; H10K 59/86; H10K 59/40;
(Continued)

(56) References Cited

U.S. PATENT DOCUMENTS

| 8,502,756 B2 | 8/2013 | Nakamura et al. |
| 9,627,450 B2 | 4/2017 | Jeung et al. |

(Continued)

FOREIGN PATENT DOCUMENTS

| CN | 206451466 U | 8/2017 |
| CN | 208607570 U | 3/2019 |

(Continued)

*Primary Examiner* — Chanh D Nguyen
*Assistant Examiner* — Aaron Midkiff
(74) *Attorney, Agent, or Firm* — CANTOR COLBURN LLP

(57) ABSTRACT

A display device includes a first pixel, a second pixel, and a third pixel. The first pixel includes a first light emitting element of a first group including a first pixel electrode disposed in a first area, a second light emitting element of the first group including a second pixel electrode electrically connected to the first pixel electrode and disposed in the first area, and a first pixel circuit electrically connected to the first light emitting element of the first group and the second light emitting element of the first group and disposed in the second area.

35 Claims, 21 Drawing Sheets

(51) Int. Cl.
*G09G 3/3233* (2016.01)
*H10K 59/121* (2023.01)
*H10K 59/122* (2023.01)
*H10K 59/65* (2023.01)

(52) U.S. Cl.
CPC ......... *H10K 59/121* (2023.02); *H10K 59/122* (2023.02); *G09G 2300/0426* (2013.01); *G09G 2300/0452* (2013.01); *G09G 2300/0852* (2013.01); *H10K 59/65* (2023.02)

(58) Field of Classification Search
CPC ............. H10K 59/00–95; H10K 59/38; G02F 1/1345; G02F 1/13454; G02F 1/136; G02F 1/136204; G02F 1/136254; G09G 2300/0426; G09G 2380/02; G09G 2300/0452; G09G 2300/0804; G09G 2300/0465; G09G 2340/0407; G09G 3/32; G09G 3/3225; G09G 3/3233; G09G 2300/0852; H01L 27/124; H01L 27/1244; G09F 9/30
See application file for complete search history.

(56) References Cited

U.S. PATENT DOCUMENTS

| | | | |
|---|---|---|---|
| 10,733,408 B2 | 8/2020 | Bok | |
| 10,733,931 B2 | 8/2020 | Jung et al. | |
| 10,903,291 B2 | 1/2021 | Ding et al. | |
| 2007/0216610 A1* | 9/2007 | Smith | H10K 59/353 345/76 |
| 2017/0269413 A1* | 9/2017 | Tamaki | G02F 1/133504 |
| 2021/0191546 A1* | 6/2021 | Zhang | H10K 50/844 |
| 2021/0193761 A1* | 6/2021 | Gee | H10K 59/123 |
| 2021/0217821 A1* | 7/2021 | Han | H10K 71/166 |
| 2021/0249624 A1 | 8/2021 | Lou et al. | |
| 2021/0327958 A1* | 10/2021 | Li | H01L 33/42 |
| 2022/0037428 A1* | 2/2022 | Lou | H10K 59/353 |
| 2022/0102466 A1* | 3/2022 | Qiu | H10K 59/122 |
| 2022/0309823 A1* | 9/2022 | Li | H10K 59/00 |
| 2022/0376029 A1* | 11/2022 | Huang | H10K 59/121 |
| 2023/0337467 A1* | 10/2023 | Che | H04M 1/0264 |

FOREIGN PATENT DOCUMENTS

| | | |
|---|---|---|
| CN | 109584794 A | 4/2019 |
| CN | 110189639 A | 8/2019 |
| CN | 110265455 A | 9/2019 |
| CN | 110277436 A | 9/2019 |
| CN | 110554738 A | 12/2019 |
| CN | 110648622 A | 1/2020 |
| CN | 110767835 A | 2/2020 |
| CN | 210182387 U | 3/2020 |
| CN | 111029390 A | 4/2020 |
| CN | 210429820 U | 4/2020 |
| CN | 210516000 U | 5/2020 |
| CN | 111710276 A | 9/2020 |
| CN | 110504287 B | 10/2020 |
| CN | 111834430 A | 10/2020 |
| CN | 112038373 A | 12/2020 |
| CN | 112257524 A | 1/2021 |
| CN | 112103329 B | 2/2021 |

\* cited by examiner

DISPLAY DEVICE AND ELECTRONIC DEVICE HAVING THE SAME

This application claims priority to Korean Patent Application No. 10-2021-0074357, filed on Jun. 8, 2021, and all the benefits accruing therefrom under 35 U.S.C. § 119, the content of which in its entirety is herein incorporated by reference.

BACKGROUND

1. Field of Disclosure

The present disclosure relates to a display device including a display area through which an optical signal transmits and an electronic device including the display device.

2. Description of the Related Art

An electronic device includes various electronic parts such as a display panel and an electronic module. The electronic module includes a camera, an infrared sensor, and a proximity sensor. The electronic module is disposed under the display panel. Some areas of the display panel have a transmittance higher than a transmittance of the other areas of the display panel. The electronic module receives an optical signal or outputs the optical signal through the areas with the relatively high transmittance.

SUMMARY

The present disclosure provides a display device capable of reducing a distortion of an optical signal and simplifying a wiring design.

The present disclosure provides an electronic device including the display device.

Embodiments of the inventive concept provide a display device including: a display panel including a base layer including a first area, a second area adjacent to the first area, and a third area adjacent to the second area, a connection line disposed on the base layer, and first, second, and third pixels disposed on the base layer. The first pixel includes: a first light emitting element of a first group including a first pixel electrode disposed in the first area; a second light emitting element of the first group including a second pixel electrode disposed in the first area; and a first pixel circuit electrically connected to the first light emitting element of the first group and the second light emitting element of the first group and disposed in the second area. The second pixel includes: a light emitting element of a second group including a pixel electrode disposed in the second area; and a second pixel circuit electrically connected to the light emitting element of the second group and disposed in the second area. The third pixel includes: a light emitting element of a third group including a pixel electrode disposed in the third area; and a third pixel circuit electrically connected to the light emitting element of the third group and disposed in the third area. The connection line includes: a first connection line which electrically connects the first pixel electrode and the first pixel circuit and a second connection line which electrically connects the first pixel electrode and the second pixel electrode. The first pixel includes a first color pixel and a second color pixel, which generate lights having different colors from each other. The second connection line which electrically connects the first pixel electrode and the second pixel electrode of the first color pixel crosses the second connection line which electrically connects the first pixel electrode and the second pixel electrode of the second color pixel, and is disposed in a layer different from a layer on which the second connection line which electrically connects the first pixel electrode and the second pixel electrode of the second color pixel is disposed.

The second light emitting element of the first group may be provided in plural, and the first pixel may include the plurality of second light emitting elements of the first group.

The first pixel may further include a third light emitting element of the first group, and the third light emitting element of the first group may include a third pixel electrode electrically connected to the second pixel electrode and disposed in the first area.

Each of the first connection line and the second connection line may include a transparent conductive oxide.

The first pixel may further include: a third light emitting element of the first group. The third light emitting element of the first group includes a third pixel electrode disposed in the first area. The display panel may further include: a third connection line which electrically connects the second pixel electrode and the third pixel electrode, and the third connection line may include a transparent conductive oxide.

The third connection line and the second pixel electrode may be disposed on a first insulating layer, and the second connection line may be connected to the second pixel electrode via a contact hole defined through the first insulating layer.

The third pixel electrode may have an area smaller than an area of the second pixel electrode in a plan view.

An edge of each of the first pixel electrode and the second pixel electrode may include a curve.

The first pixel electrode may have an area greater than an area of the second pixel electrode in the plan view.

The second connection line and the first pixel electrode may be disposed on the same insulating layer.

The first pixel electrode may have an oval shape, and the second pixel electrode may have a circular shape.

The display device may further include color filters overlapping the first pixel electrode, the second pixel electrode, the pixel electrode of the light emitting element of the second group, and the pixel electrode of the light emitting element of the third group, respectively, and disposed on the display panel.

The display device may further include an input sensor including a sensing electrode overlapping at least the third area, and the input sensor is disposed on the display panel.

The first area may include a transmission area through which an optical signal provided from or applied to an electronic module transmits and an element area overlapping the first pixel electrode.

The pixel electrode of the light emitting element of the third group may have an area smaller than an area of each of the first pixel electrode and the second pixel electrode and has an area smaller than the pixel electrode of the light emitting element of the second group.

The number of the pixel electrodes of the light emitting element of the third group disposed in a unit area may be greater than a number of the pixel electrodes of the light emitting element of the second group disposed in the unit area.

Embodiments of the inventive concept provide a display device including: a display panel including a base layer including a first area, a second area adjacent to the first area, and a third area adjacent to the second area and first, second, and third pixels disposed on the base layer. The first pixel includes: a first light emitting element of a first group including a first pixel electrode disposed in the first area, a second light emitting element of the first group including a second pixel electrode electrically connected to the first pixel electrode and disposed in the first area, and a first pixel circuit electrically connected to the first light emitting element of the first group and the second light emitting element of the first group and disposed in the second area. The second pixel includes: a light emitting element of a second group including a pixel electrode disposed in the second area and a second pixel circuit electrically connected to the light emitting element of the second group and disposed in the second area. The third pixel includes: a light emitting element of a third group including a pixel electrode disposed in the third area and a third pixel circuit electrically connected to the light emitting element of the third group and disposed in the third area. The first pixel electrode has an area greater than an area of the second pixel electrode in a plan view, and the first pixel electrode includes a first outer edge having a curved shape and a first inner edge having a curved shape to define an opening.

The display panel may further include: a ring pattern overlapping the first outer edge in the plan view; and a dummy pattern overlapping the opening and the first inner edge in the plan view.

Each of the ring pattern and the dummy pattern may include a black coloring agent.

The display panel may further include: a pixel definition layer, and the pixel definition layer is provided with a first opening and a second opening, which are defined therethrough to expose the pixel electrode of the light emitting of the second group and the pixel electrode of the light emitting element of the third group, respectively.

The pixel electrode of the light emitting element of the second group may include a second outer edge having a curved shape and a second inner edge having a curved shape to define the first opening.

The display panel may further include a dummy pattern overlapping the first opening and the second inner edge in the plan view.

The first pixel electrode may have an oval shape, and the second pixel electrode may have a circular shape.

Each of the pixel electrode of the light emitting element of the second group and the pixel electrode of the light emitting element of the third group may have a circular shape.

Embodiments of the inventive concept provide a display device including: a display panel including a base layer including a first area, a second area adjacent to the first area, and a third area adjacent to the second area and first, second, and third pixels disposed on the base layer. The first pixel includes: a light emitting element of a first group including a pixel electrode disposed in the first area and a first pixel circuit electrically connected to the light emitting element of the first group and disposed in the second area. The second pixel includes: a first light emitting element of a second group including a first pixel electrode disposed in the second area, a second light emitting element of the second group including a second pixel electrode electrically connected to the first pixel electrode and disposed in the second area, and a second pixel circuit electrically connected to the first light emitting element of the second group and the second light emitting element of the second group and disposed in the second area. The third pixel includes: a light emitting element of a third group including a pixel electrode disposed in the third area and a third pixel circuit electrically connected to the light emitting element of the third group and disposed in the third area.

The second light emitting element of the second group may be provided in plural, and the second pixel may include the plurality of second light emitting elements of the second group.

The display panel further may include a connection line which electrically connects the first pixel electrode and the second pixel electrode. The connection line and the first pixel electrode may be disposed in the same insulating layer.

The connection line may be provided integrally with the first pixel electrode and include the same material as the first pixel electrode.

The display panel may further include: a connection line which electrically connects the first pixel electrode and the second pixel electrode. The connection line and the first pixel electrode may be disposed on different layers from each other.

The second pixel may further include a third light emitting element of the second group, and the third light emitting element of the second group may include a third pixel electrode electrically connected to the second pixel electrode and disposed in the second area.

The display panel may further include: a first connection line which electrically connects the first pixel electrode and the second pixel electrode and a second connection line which electrically connects the second pixel electrode and the third pixel electrode. Each of the first connection line and the second connection line may be disposed on the same layer as the first pixel electrode.

The first connection line may be provided integrally with the first pixel electrode and includes the same material as the first pixel electrode.

The second pixel may further includes: a third light emitting element of the second group. The third light emitting element of the second group may include a third pixel electrode connected to the first pixel electrode or the second pixel electrode via a connection line and disposed in the second area.

The connection line and the first pixel electrode may be disposed directly on different insulating layers from each other.

The second pixel electrode may have substantially the same area as the third pixel electrode in a plan view.

According to the above, the pixel electrode disposed in the first area includes the edge with a curved shape, and thus, a diffraction of an optical signal is reduced. As the number of the connection lines disposed in the first area and the second area decreases, a short circuit between the connection lines is effectively prevented.

In addition, since the pixel electrode has the ring pattern, gases generated during the manufacturing process are discharged from a lower portion of the pixel electrode to an upper portion of the pixel electrode. Therefore, defects occurring in the manufacturing process of the display panel are effectively reduced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
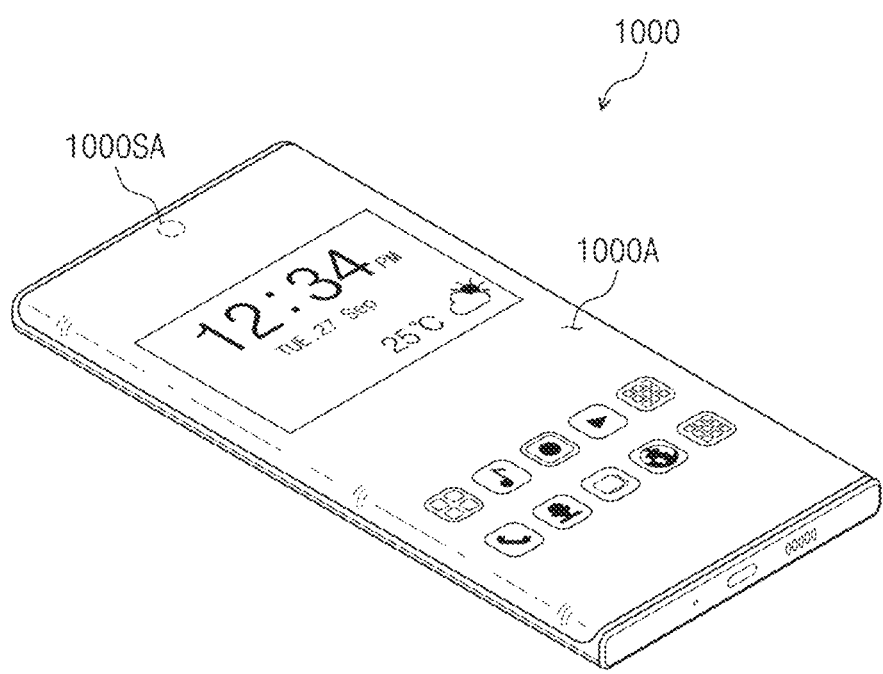
FIG. 1 is a perspective view showing an electronic device according to an embodiment of the present disclosure.
Figure 1:
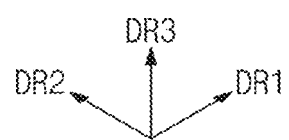

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

FIG. 1 is a perspective view showing an electronic device 1000 according to an embodiment of the present disclosure.

Referring to FIG. 1, the electronic device 1000 may include a display device, and a mobile phone is shown as a representative example in the present embodiment. However, the electronic device 1000 should not be limited to the mobile phone, and the electronic device 1000 may be a tablet computer, a monitor, a television, a car navigation unit, a game unit, or a wearable device.

The electronic device 1000 may display an image through a display area 1000A. The display area 1000A may include a plane defined by a first direction DR1 and a second direction DR2. The display area 1000A may further include curved surfaces bent from at least two sides of the plane. However, the shape of the display area 1000A according to the invention should not be limited thereto or thereby. For example, the display area 1000A may include only the plane, or the display area 1000A may further include two or more curved surfaces, e.g., four curved surfaces respectively bent from four sides of the plane in another embodiment.

An area of the display area 1000A may be defined as a sensing area 1000SA. FIG. 1 shows one sensing area 1000SA as a representative example, however, the number of the sensing areas 1000SA should not be limited thereto or thereby. The sensing area 1000SA may be a portion of the display area 1000A, however, the sensing area 1000SA may have a transmittance higher than that of the other areas of the display area 1000A with respect to an optical signal. Accordingly, the image may be displayed through the sensing area 1000SA, and the optical signal may be provided through the sensing area 1000SA.

The electronic device 1000 may include an electronic module disposed in an area overlapping the sensing area 1000SA. The electronic module may receive the optical signal provided from the outside through the sensing area 1000SA or may output the optical signal through the sensing area 1000SA. As an example, the electronic module may be a camera module, a sensor that measures a distance between an object and a mobile phone, such as a proximity sensor, a sensor that recognizes a part of a user's body, e.g., a fingerprint, an iris, or a face, or a small lamp that outputs a light, however, it should not be particularly limited.

A third direction DR3 may indicate a normal line direction of the display area 1000A, i.e., a thickness direction of the electronic device 1000. Front (or upper) and rear (or lower) surfaces of each member of the electronic device 1000 may be distinguished from each other with respect to the third directional axis DR3.

Figure 2:
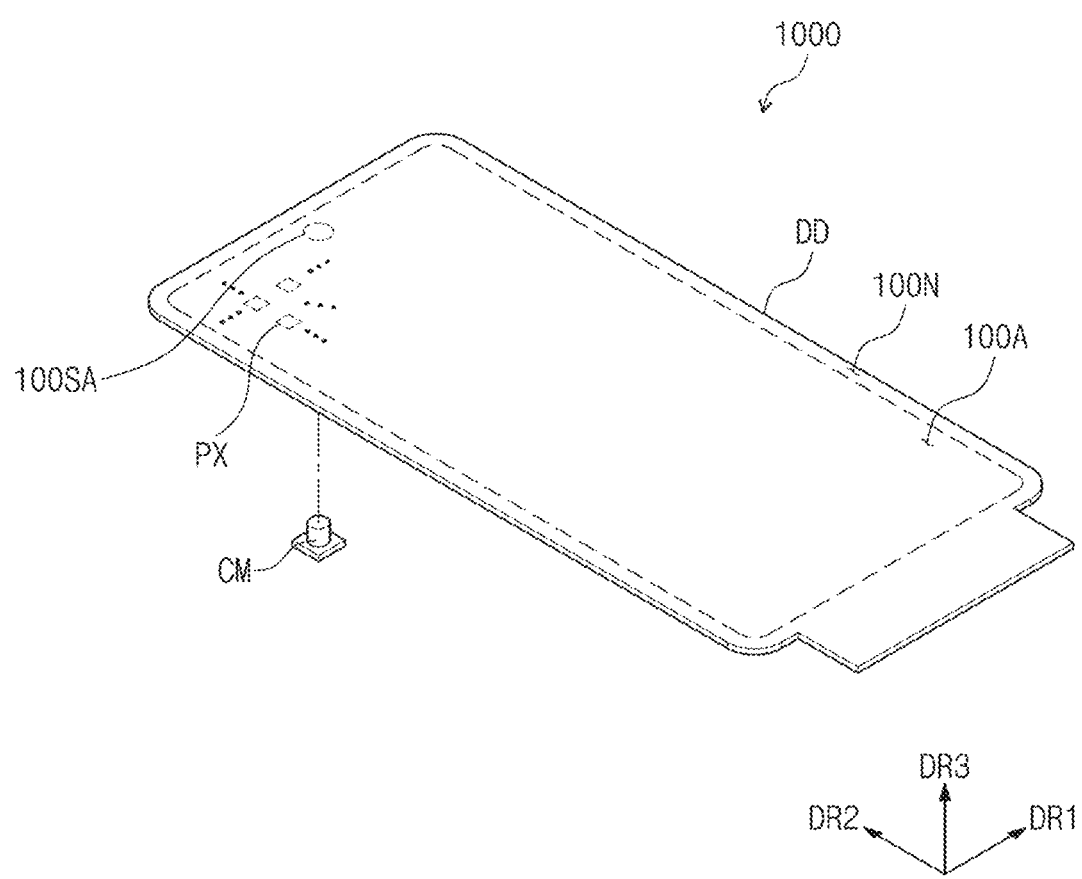
FIG. 2 is an exploded perspective view showing some components of an electronic device according to an embodiment of the present disclosure.

FIG. 2 is an exploded perspective view showing some components of the electronic device 1000 according to an embodiment of the present disclosure.

Referring to FIG. 2, the electronic device 1000 may include the display device DD and a camera module CM. The display device DD may generate the image and may sense an external input. The camera module CM may be disposed under the display device DD. When the display device DD is defined as a first electronic module for the electronic device 1000, the camera module CM may be defined as a second electronic module.

The display device DD may include a display area 100A and a peripheral area 100N. The display area 100A may correspond to the display area 1000A shown in FIG. 1. A portion of the display device DD may be defined as a sensing area 100SA, and the sensing area 100SA may have a transmittance higher than that of the other area (hereinafter, referred to as a main display area) of the display area 100A. Accordingly, the sensing area 100SA may provide an external natural light to the camera module CM. The sensing area 100SA may be a portion of the display area 100A, and thus, the image may be displayed through the sensing area 100SA.

A pixel PX may be disposed in the display area 100A. The pixel PX may be disposed in each of the sensing area 100SA and the main display area. However, the pixel PX disposed in the sensing area 100SA and the pixel PX disposed in the main display area may have different structures from each other, and this will be described in detail later.

Figure 3:
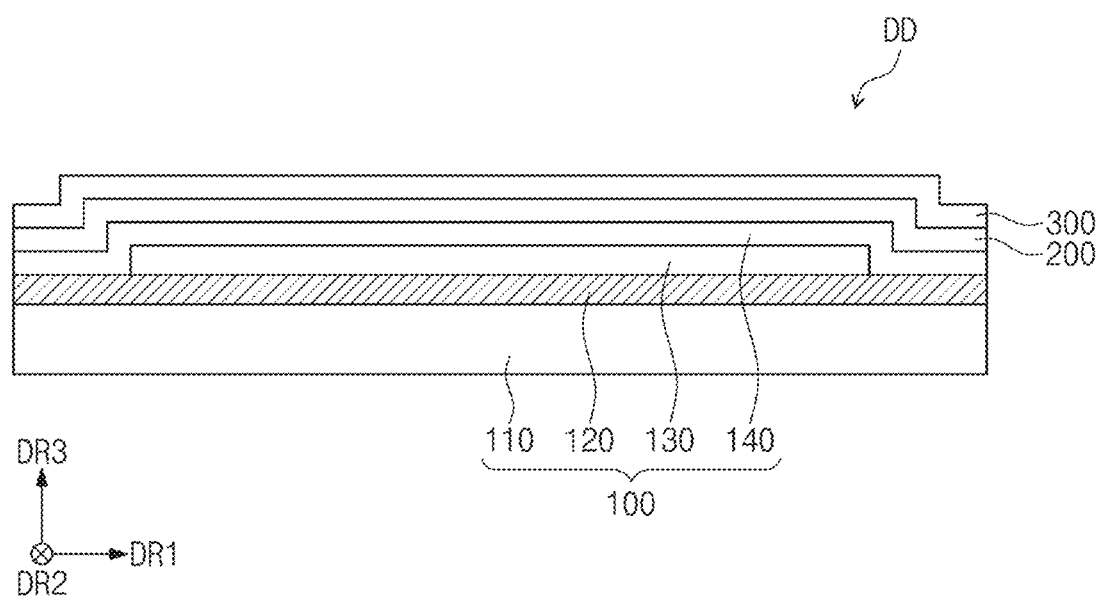
FIG. 3 is a cross-sectional view showing a display device according to an embodiment of the present disclosure.

FIG. 3 is a cross-sectional view showing the display device DD according to an embodiment of the present disclosure.

Referring to FIG. 3, the display device DD may include a display panel 100, a sensor layer 200, and an anti-reflective layer 300.

The display panel 100 may have a configuration that substantially generates the image. The display panel 100 may be a light emitting type display panel. For example, the display panel 100 may be an organic light emitting display panel, an inorganic light emitting display panel, a micro-LED display panel, or a nano-LED display panel. The display panel 100 may be referred to as a display layer.

The display panel 100 may include a base layer 110, a circuit layer 120, a light emitting element layer 130, and an encapsulation layer 140.

The base layer 110 may be a member that provides a base surface on which the circuit layer 120 is disposed. The base layer 110 may be a rigid substrate or a flexible substrate that is bendable, foldable, or rollable. The base layer 110 may be a glass substrate, a metal substrate, or a polymer substrate, however, the invention should not be limited thereto or thereby. According to another embodiment, the base layer 110 may be an inorganic layer, an organic layer, or a composite material layer.

The base layer 110 may have a multi-layer structure. For instance, the base layer 110 may include a first synthetic resin layer, an inorganic layer having a single-layer or multi-layer structure, and a second synthetic resin layer disposed on the inorganic layer having a single-layer or multi-layer structure. Each of the first and second synthetic resin layers may include a polyimide-based resin, however, it should not be particularly limited.

The circuit layer 120 may be disposed on the base layer 110. The circuit layer 120 may include an insulating layer, a semiconductor pattern, a conductive pattern, and a signal line. An insulating layer, a semiconductor layer, and a conductive layer may be formed on the base layer 110 by a coating or depositing process. Then, the insulating layer, the semiconductor layer, and the conductive layer may be selectively patterned through several photolithography processes.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from moisture, oxygen, and a foreign substance such as dust particles. The encapsulation layer 140 may include at least one inorganic layer. The encapsulation layer 140 may include a stack structure in which an inorganic layer, an organic layer, and an inorganic layer are sequentially stacked.

The sensor layer 200 may be disposed on the display panel 100. The sensor layer 200 may sense an external input applied thereto from the outside. For example, the external input may be a user input. The user input may include a variety of external inputs, such as a part of user's body, light, heat, pen, or pressure.

The sensor layer 200 may be formed on the display panel 100 through successive processes. In this case, the sensor layer 200 may be disposed directly on the display panel 100. In the present disclosure, the expression "the sensor layer 200 is disposed directly on the display panel 100" means that no intervening elements are present between the sensor layer 200 and the display panel 100. That is, a separate adhesive member may not be disposed between the sensor layer 200 and the display panel 100.

The anti-reflective layer 300 may be disposed on the sensor layer 200. The anti-reflective layer 300 may reduce a reflectance of the external light incident to the display device DD from the outside. The anti-reflective layer 300 may be formed on the sensor layer 200 through successive processes. The anti-reflective layer 300 may include color filters. The color filters may be arranged in a predetermined arrangement. The arrangement of the color filters may be determined by taking into account colors of lights emitted from pixels included in the display panel 100. In addition, the anti-reflective layer 300 may further include a black matrix adjacent to the color filters. The anti-reflective layer 300 will be described in detail later.

According to an embodiment, the sensor layer 200 may be omitted. In this case, the anti-reflective layer 300 may be disposed directly on the display panel 100. According to an embodiment, positions of the sensor layer 200 and the anti-reflective layer 300 may be changed with each other.

Although not shown in figures, according to an embodiment, the display device DD may further include an optical layer disposed on the anti-reflective layer 300. As an example, the optical layer may be formed on the anti-reflective layer 300 through successive processes. The optical layer may control a direction of the light incident from the display panel 100 to improve a front luminance of the display device DD. As an example, the optical layer may include an organic insulating layer through which openings are defined to respectively correspond to light emitting areas of the pixels included in the display panel 100 and a high refractive index layer covering the organic insulating layer and filled in the openings. The high refractive index layer may have a refractive index higher than that of the organic insulating layer.

Figure 4:
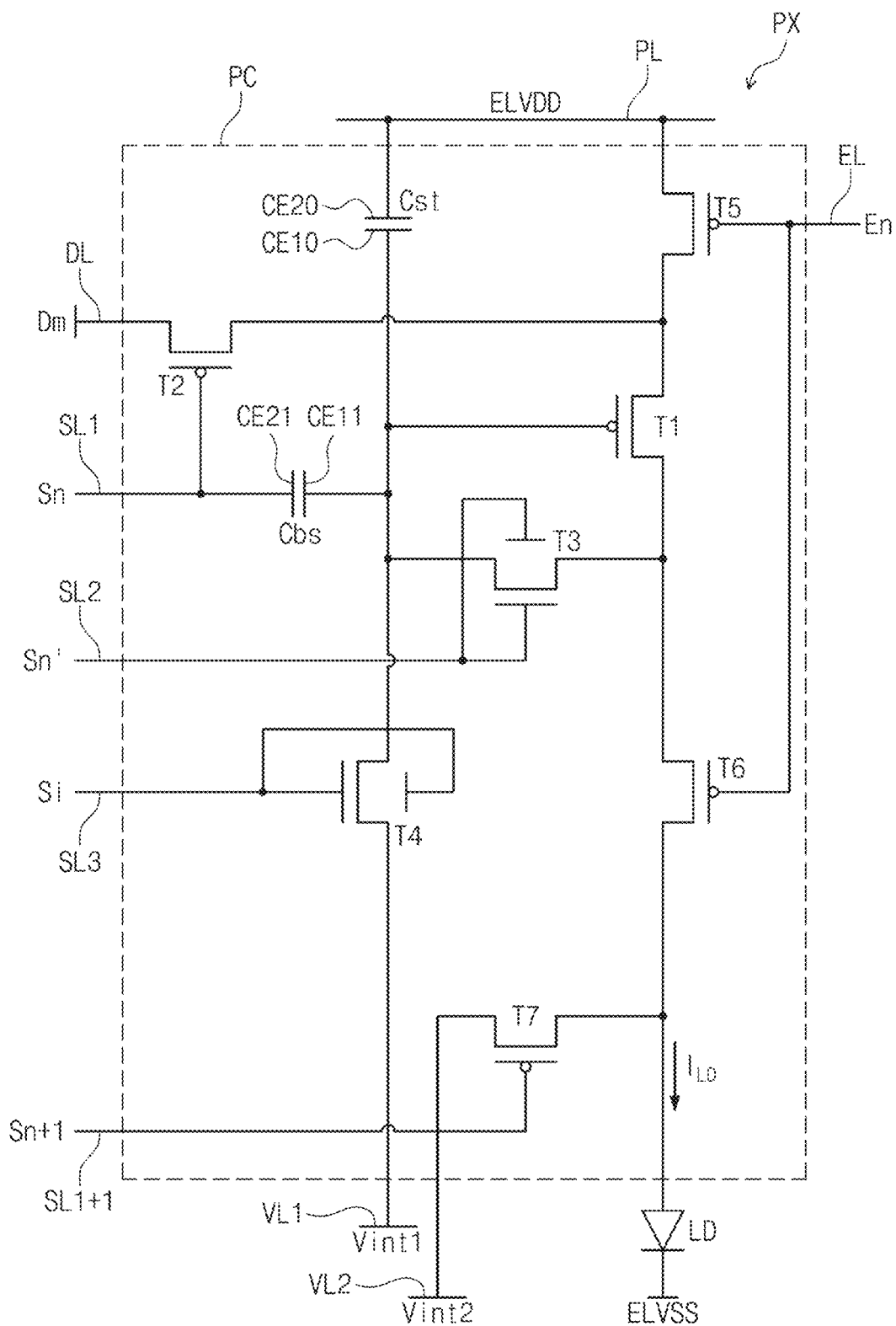
FIG. 4 is an equivalent circuit diagram showing a pixel according to an embodiment of the present disclosure.

FIG. 4 is an equivalent circuit diagram showing the pixel PX according to an embodiment of the present disclosure.

FIG. 4 shows an equivalent circuit diagram of one pixel PX among the pixels PX shown in FIG. 2. The pixel PX may include a light emitting element LD and a pixel circuit PC. The light emitting element LD may be a component included in the light emitting element layer 130 of FIG. 3, and the pixel circuit PC may be a component included in the circuit layer 120 of FIG. 3.

The pixel circuit PC may include a plurality of thin film transistors T1 to T7 and a storage capacitor Cst. The thin film transistors T1 to T7 and the storage capacitor Cst may be electrically connected to signal lines SL1, SL2, SL3, SL1+1, EL, and DL, a first initialization voltage line VL1, a second initialization voltage line VL2 (or referred to as an anode initialization voltage line), and a driving voltage line PL.

The thin film transistors T1 to T7 may include a driving thin film transistor T1 (or referred to as a first thin film transistor), a switching thin film transistor T2 (or referred to as a second thin film transistor), a compensation thin film transistor T3 (or referred to as a third thin film transistor), a first initialization thin film transistor T4 (or referred to as a fourth thin film transistor), an operation control thin film transistor T5 (or referred to as a fifth thin film transistor), an emission control thin film transistor T6 (or referred to as a sixth thin film transistor), and a second initialization thin film transistor T7 (or referred to as a seventh thin film transistor).

The light emitting element LD may include a first electrode, e.g., an anode electrode or a pixel electrode, and a second electrode, e.g., a cathode electrode or a common electrode. The first electrode of the light emitting element LD may be connected to the driving thin film transistor T1 via the emission control thin film transistor T6 to receive a driving current $I_{LD}$, and the second electrode may receive a low power voltage ELVSS. The light emitting element LD may generate a light having a luminance corresponding to the driving current $I_{LD}$.

Some transistors of the thin film transistors T1 to T7 may be an n-channel MOSFET ("NMOS"), and the other transistors of the thin film transistors T1 to T7 may be a p-channel MOSFET ("PMOS"). As an example, the compensation thin film transistor T3 and the first initialization thin film transistor T4 among the thin film transistors T1 to T7 may be the re-channel MOSFET (NMOS), and the other transistors among the thin film transistors T1 to T7 may be the p-channel MOSFET (PMOS).

According to an embodiment, among the thin film transistors T1 to T7, the compensation thin film transistor T3, the first initialization thin film transistor T4, and the second initialization thin film transistor T7 may be the NMOS, and the other transistors may be the PMOS. According to an embodiment, among the thin film transistors T1 to T7, only one transistor may be the NMOS, and the other transistors may be the PMOS. According to an embodiment, all the thin film transistors T1 to T7 may be the NMOS or the PMOS.

The signal lines may include a first present scan line SL1 transmitting a first scan signal Sn, a second present scan line SL2 transmitting a second scan signal Sn', a third scan line SL3 transmitting a third scan signal S1 to the first initialization thin film transistor T4, an emission control line EL transmitting an emission control signal En to the operation control thin film transistor T5 and the emission control thin film transistor T6, a next scan line SL1+1 transmitting a next scan signal Sn+1 to the second initialization thin film transistor T7, and a data line DL crossing the first present scan line SL1 and transmitting a data signal Dm. The first scan signal Sn may be a current scan signal, and the next scan signal Sn+1 may be a scan signal immediately following the first scan signal Sn.

The driving voltage line PL may transmit a driving voltage ELVDD to the driving thin film transistor T1, and the first initialization voltage line VL1 may transmit an initialization voltage Vint1 to initialize the driving thin film transistor T1 and the first electrode of the light emitting element LD.

A gate of the driving thin film transistor T1 may be connected to the storage capacitor Cst, a source of the driving thin film transistor T1 may be connected to the driving voltage line PL via the operation control thin film transistor T5, and a drain of the driving thin film transistor T1 may be electrically connected to the first electrode of the light emitting element LD via the emission control thin film transistor T6. The driving thin film transistor T1 may receive the data signal Dm in response to a switching operation of the switching thin film transistor T2 and may supply the driving current $I_{LD}$ to the light emitting element LD.

A gate of the switching thin film transistor T2 may be connected to the first present scan line SL1 transmitting the first scan signal Sn, a source of the switching thin film transistor T2 may be connected to the data line DL, and a drain of the switching thin film transistor T2 may be connected to the source of the driving thin film transistor T1 and may be connected to the driving voltage line PL via the operation control thin film transistor T5. The switching thin film transistor T2 may be turned on in response to the first scan signal Sn provided through the first present scan line SL1 and may perform the switching operation to transmit the data signal Dm applied to the data line DL to the source of the driving thin film transistor T1.

A gate of the compensation thin film transistor T3 may be connected to the second present scan line SL2. A drain of the compensation thin film transistor T3 may be connected to the drain of the driving thin film transistor T1 and may be connected to the first electrode of the light emitting element LD via the emission control thin film transistor T6. A source of the compensation thin film transistor T3 may be connected to a first electrode CE10 of the storage capacitor Cst and the gate of the driving thin film transistor T1. In addition, the source of the compensation thin film transistor T3 may be connected to a drain of the first initialization thin film transistor T4.

The compensation thin film transistor T3 may be turned on in response to the second scan signal Sn' applied thereto via the second present scan line SL2 and may electrically connect the gate and the drain of the driving thin film transistor T1 to allow the driving thin film transistor T1 to be connected in a diode configuration.

A gate of the first initialization thin film transistor T4 may be connected to the third scan line SL3. A source of the first initialization thin film transistor T4 may be connected to a source of the second initialization thin film transistor T7 and the first initialization voltage line VL1. The drain of the first initialization thin film transistor T4 may be connected to the first electrode CE10 of the storage capacitor Cst, the source of the compensation thin film transistor T3, and the gate of the driving thin film transistor T1. The first initialization thin film transistor T4 may be turned on in response to the third scan signal S1 applied thereto through the third scan line SL3 and may transmit the initialization voltage Vint1 to the gate of the driving thin film transistor T1 to perform an initialization operation that initializes a voltage of the gate of the driving thin film transistor T1.

A gate of the operation control thin film transistor T5 may be connected to the emission control line EL, a source of the operation control thin film transistor T5 may be connected to the driving voltage line PL, and a drain of the operation control thin film transistor T5 may be connected to the source of the driving thin film transistor T1 and the drain of the switching thin film transistor T2.

A gate of the emission control thin film transistor T6 may be connected to the emission control line EL, a source of the emission control thin film transistor T6 may be connected to the drain of the driving thin film transistor T1 and the drain of the compensation thin film transistor T3, and a drain of the emission control thin film transistor T6 may be connected to a drain of the second initialization thin film transistor T7 and the first electrode of the light emitting element LD.

The operation control thin film transistor T5 and the emission control thin film transistor T6 may be substantially simultaneously turned on in response to the emission control signal En applied thereto via the emission control line EL, and the driving voltage ELVDD may be applied to the light emitting element LD to allow the driving current $I_{LD}$ to flow through the light emitting element LD.

A gate of the second initialization thin film transistor T7 may be connected to the next scan line SL1+1, the drain of the second initialization thin film transistor T7 may be connected to the drain of the emission control thin film transistor T6 and the first electrode of the light emitting element LD, and the source of the second initialization thin film transistor T7 may be connected to the second initialization voltage line VL2 to receive an anode initialization voltage Vint2. The second initialization thin film transistor T7 may be turned on in response to the next scan signal Sn+1 applied thereto via the next scan line SL1+1 to initialize the first electrode of the light emitting element LD.

According to an embodiment, the second initialization thin film transistor T7 may be connected to the emission control line EL and may be driven in response to the emission control signal En. Meanwhile, positions of the source and the drain may be changed with each other depending on the types, e.g., a p-type or an n-type, of the transistor.

The storage capacitor Cst may include the first electrode CE10 and a second electrode CE20. The first electrode CE10 of the storage capacitor Cst may be connected to the gate of the driving thin film transistor T1, and the second electrode CE20 of the storage capacitor Cst may be connected to the driving voltage line PL. The storage capacitor Cst may be charged with electric charges corresponding to a difference between the voltage of the gate of the driving thin film transistor T1 and the driving voltage ELVDD.

A boosting capacitor Cbs may include a first electrode CE11 and a second electrode CE21. The first electrode CE11 of the boosting capacitor Cbs may be connected to the first electrode CE10 of the storage capacitor Cst, and the second electrode CE21 of the boosting capacitor Cbs may receive the first scan signal Sn. The boosting capacitor Cbs may boost the voltage of the gate of the driving thin film transistor T1 at a time point at which the provision of the first scan signal Sn is stopped, and thus a voltage drop of the gate may be compensated for.

Detailed operations of each pixel PX according to an embodiment are as follows.

When the third scan signal S1 is provided via the third scan line SL3 during an initialization period, the first initialization thin film transistor T4 may be turned on in response to the prior scan signal Sn−1, the driving thin film transistor T1 may be initialized by the initialization voltage Vint1 provided from the first initialization voltage line VL1.

When the first scan signal Sn and the second scan signal Sn' are provided via the first present scan line SL1 and the second present scan line SL2 during a data programming period, the switching thin film transistor T2 and the compensation thin film transistor T3 may be turned on in response to the first scan signal Sn and the second scan signal Sn'. In this case, the driving thin film transistor T1 may be connected in a diode configuration by the turned-on compensation thin film transistor T3 and may be forward biased.

Then, a compensation voltage Dm+Vth (Vth is a negative (−) value) obtained by subtracting a threshold voltage Vth of the driving thin film transistor T1 from the data signal Dm provided from the data line DL may be applied to the gate of the driving thin film transistor T1.

The driving voltage ELVDD and the compensation voltage Dm+Vth may be respectively applied to both ends of the storage capacitor Cst, and the storage capacitor Cst may be charged with electric charges corresponding to a difference in voltage between the both ends thereof.

During a light emitting period, the operation control thin film transistor T5 and the emission control thin film transistor T6 may be turned on by the emission control signal En provided from the emission control line EL. The driving current $I_{LD}$ according to the difference between the voltage of the gate of the driving thin film transistor T1 and the driving voltage ELVDD may be generated, and the driving current $I_{LD}$ may be supplied to the light emitting element LD via the emission control thin film transistor T6.

According to the present embodiment, at least one of the thin film transistors T1 to T7 may include a semiconductor layer containing oxide, and the other of the thin film transistors T1 to T7 may include a semiconductor layer containing silicon.

In detail, the driving thin film transistor T1, which directly affects the luminance of the display device, may include the semiconductor layer containing polycrystalline silicon with high reliability, and thus, the display device with high resolution may be implemented.

Meanwhile, since the oxide semiconductor has a high carrier mobility and a low leakage current, the voltage drop is not large even though the driving time is long. That is, even when the pixels PX are driven at low frequency, a change in color of the image due to the voltage drop is not large, and thus, the pixels PX may be driven at low frequency.

As described above, since the oxide semiconductor has low leakage current, at least one of the compensation thin film transistor T3, the first initialization thin film transistor T4, and the second initialization thin film transistor T7, which are connected to the gate of the driving thin film transistor T1, may include the oxide semiconductor. Thus, the leakage current may be prevented from flowing to the gate of the driving thin film transistor T1, and power consumption may be reduced.

Figure 5:
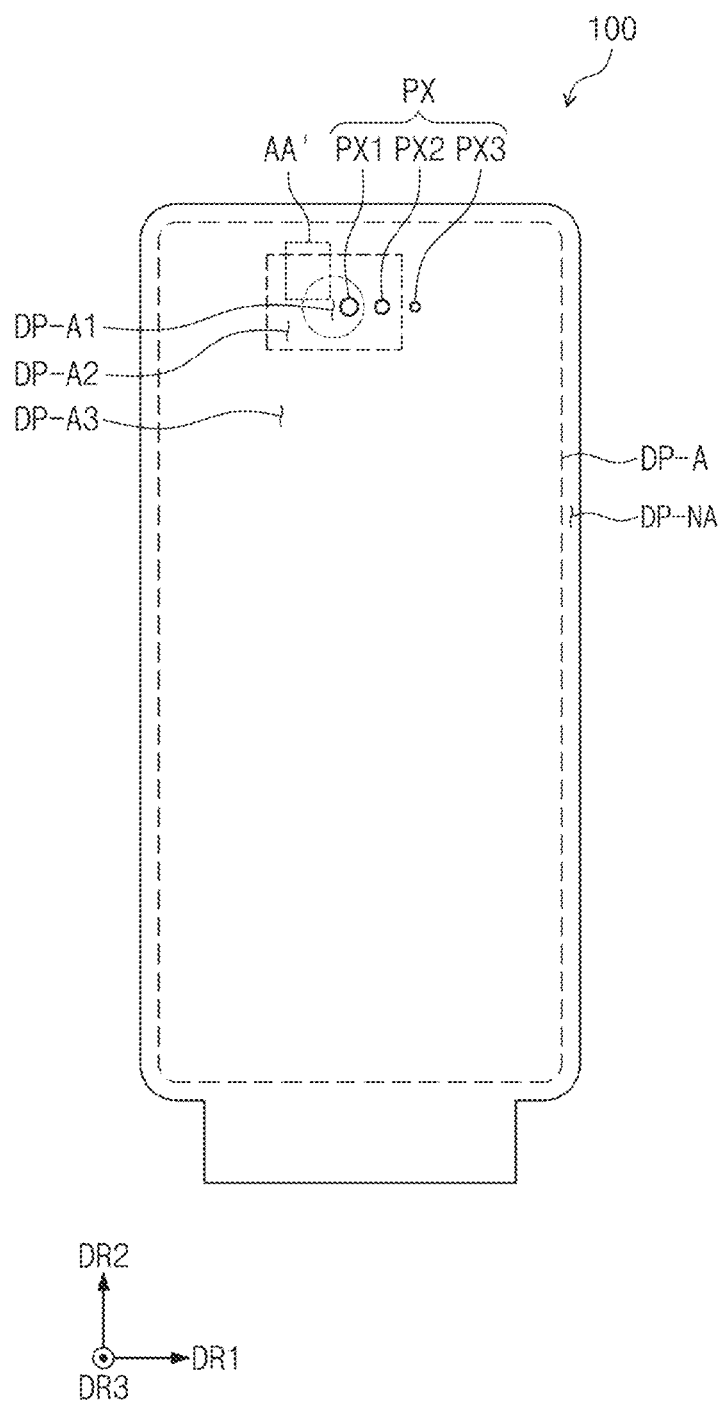
FIG. 5 is a plan view showing a display panel according to an embodiment of the present disclosure.
Figure 6A:
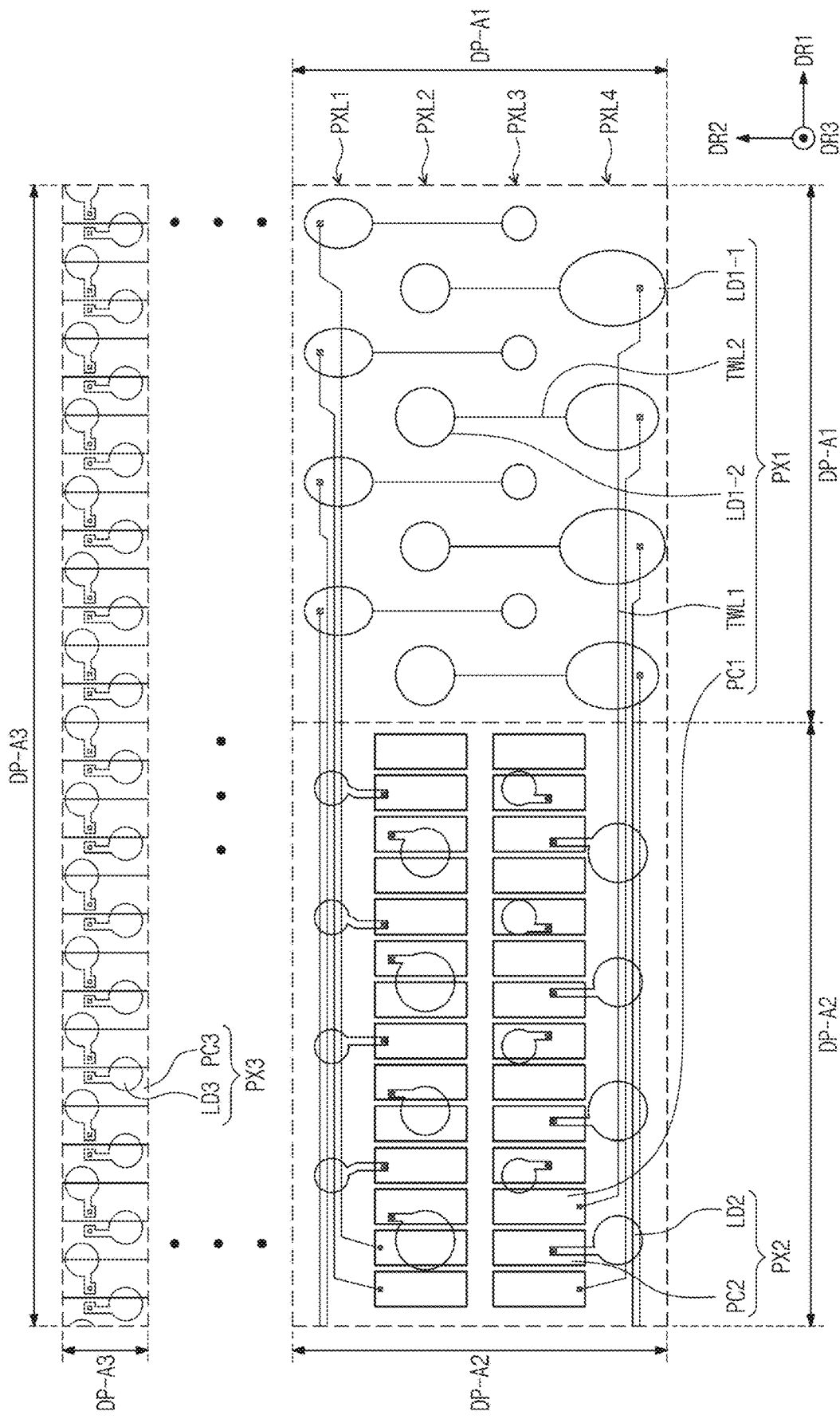
FIGS. 6A and 6B are enlarged plan views showing an area AA' of FIG. 5.
Figure 6B:
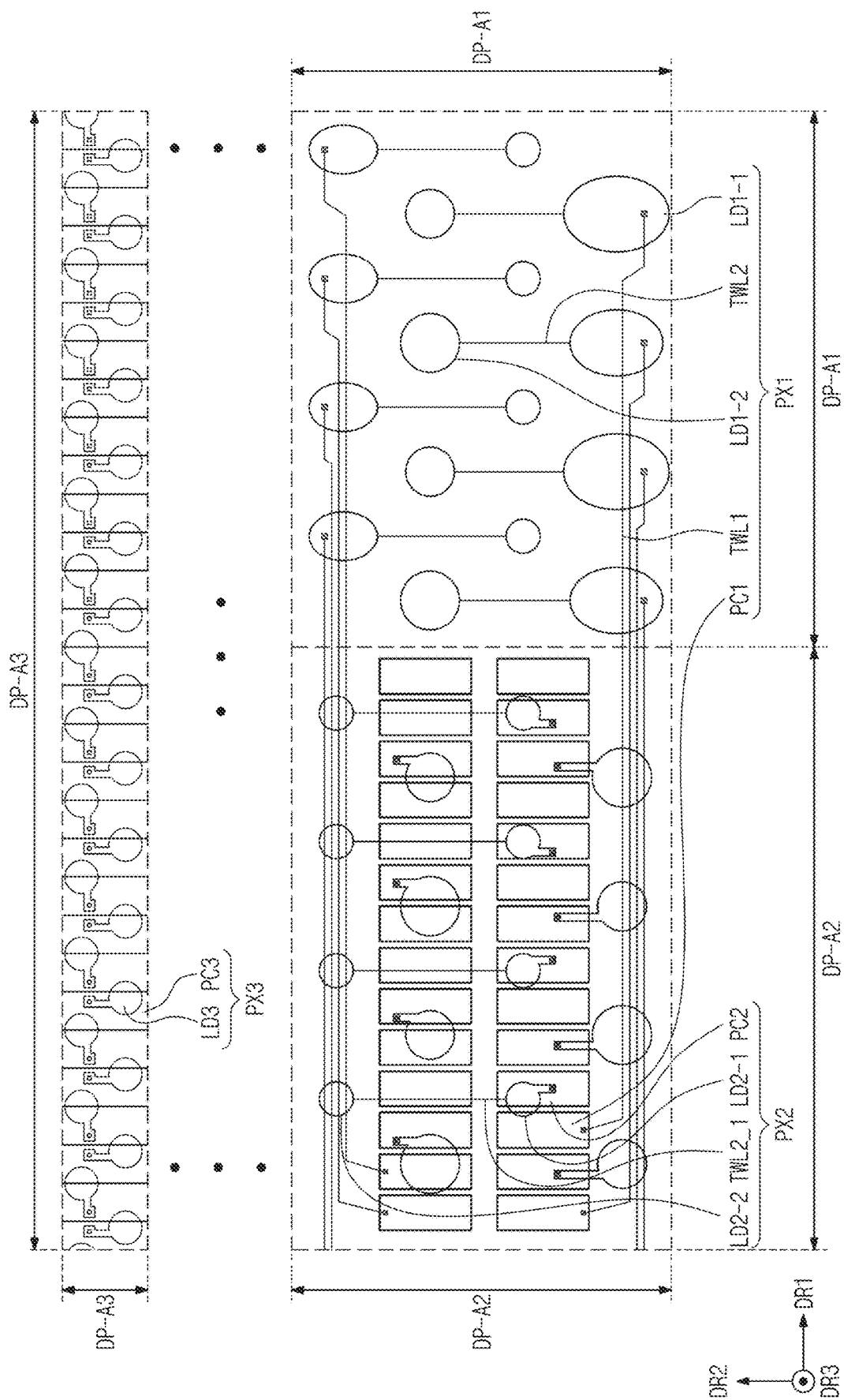

FIG. 5 is a plan view showing the display panel 100 according to an embodiment of the present disclosure. FIGS. 6A and 6B are enlarged plan views showing an area AA' of FIG. 5.

Referring to FIGS. 5 and 6A, the display panel 100 may include a display area DP-A and a peripheral area DP-NA. The peripheral area DP-NA may be defined adjacent to the display area DP-A and may surround at least a portion of the display area DP-A.

The display area DP-A may include a first area DP-A1, a second area DP-A2, and a third area DP-A3. The second area DP-A2 is disposed adjacent to the first area DP-A1, and the third area DP-A3 is disposed adjacent to the second area DP-A2. The first area DP-A1 may overlap or correspond to the sensing area 1000SA shown in FIG. 1 or the sensing area 100SA shown in FIG. 2. In the present embodiment, the first area DP-A1 is shown as a circular shape, however, the shape of the first area DP-A1 according to the invention should not be limited thereto or thereby. The first area DP-A1 may have a variety of shapes, such as a polygonal shape, an oval shape, a figure having at least one curved side, or an irregular shape in another embodiment.

The first area DP-A1, the second area DP-A2, and the third area DP-A3 may be distinguished from each other by a light transmittance or a resolution. The light transmittance and the resolution may be measured in a unit area.

The first area DP-A1 may have a light transmittance higher than each of a light transmittance of the second area DP-A2 and a light transmittance of the third area DP-A3. This is because the first area DP-A1 has a ratio of an area occupied by a light blocking structure, which is described later, to an entire area is lower in the first area DP-A1 than each of the corresponding ratio in the second area DP-A2 and the corresponding ratio the third area DP-A3. The light blocking structure may include a conductive pattern of a circuit layer, a pixel definition layer, and a pixel definition pattern described later.

The third area DP-A3 may have a resolution higher than each of a resolution of the first area DP-A1 and a resolution of the second area DP-A2. The number of light emitting elements disposed in the unit area (or in an area of the same size) may be larger in the third area DP-A3 than each of the corresponding number in the first area DP-A1 and the corresponding number the second area DP-A2.

When distinguishing based on the light transmittance, the first area DP-A1 may be a first transmittance area, and the second area DP-A2 and the third area DP-A3 may correspond to different portions of a second transmittance area, which is distinguished from the first transmittance area. The second area DP-A2 may have substantially the same transmittance as the transmittance of the third area DP-A3. Although the transmittance of the second area DP-A2 is not the same as the transmittance of the third area DP-A3, when the first area DP-A1 is defined as the first transmittance area, the second area DP-A2 and the third area DP-A3 may be defined as the second transmittance area since the transmittance of the first area DP-A1 is significantly higher than the transmittance of each of the second area DP-A2 and the third area DP-A3.

When distinguishing based on the resolution, the first area DP-A1 and the second area DP-A2 may correspond to different portions of a first resolution area, and the third area DP-A3 may be a second resolution area, which is distinguished from the first resolution area. The number of light emitting elements of the first area DP-A1 per unit area may be substantially the same as the number of light emitting elements of the second area DP-A2 per unit area.

The display panel 100 may include a plurality of pixels PX. The display panel 100 may include a first pixel PX1 including a light emitting element disposed in the first area DP-A1, a second pixel PX2 including a light emitting element disposed in the second area DP-A2, and a third pixel PX3 including a light emitting element disposed in the third area DP-A3. Each of the first pixel PX1, the second pixel PX2, and the third pixel PX3 may include the pixel circuit PC shown in FIG. 4. According to the present embodiment, when the third pixel PX3 includes one light emitting element LD shown in FIG. 4, at least one of the first pixel PX1 and the second pixel PX2 may include two or more light emitting elements LD connected to each other in parallel. This will be described in detail later.

Each of the first pixel PX1, the second pixel PX2, and the third pixel PX3 may be provided in plural. In this case, the first, second, and third pixels PX1, PX2, and PX3 may include a red pixel, a green pixel, and a blue pixel, respectively, and may further include a white pixel according to an embodiment.

Referring to FIG. 6A, the first pixel PX1 may include light emitting elements LD1-1 and LD1-2 of a first group and a first pixel circuit PC1 electrically connected to the light emitting elements LD1-1 and LD1-2 of the first group. The second pixel PX2 may include a light emitting element LD2 of a second group and a second pixel circuit PC2 to drive the light emitting element LD2 of the second group, and the third pixel PX3 may include a light emitting element LD3 of a third group and a third pixel circuit PC3 to drive the light emitting element LD3 of the third group.

The first pixel PX1, the second pixel PX2, and the third pixel PX3 shown in FIG. 5 are illustrated with respect to positions of corresponding light emitting elements LD1-1, LD1-2, LD2, and LD3. In FIG. 6A, the first electrode of the light emitting element is shown as a representative of each of the light emitting elements LD1-1 and LD1-2 of the first group, the light emitting element LD2 of the second group, and the light emitting element LD3 of the third group.

The number of the light emitting elements LD1-1 and LD1-2 of the first group per the unit area is smaller than the number of the light emitting element LD3 of the third group per the unit area to increase a transmission size and improve the transmittance of the first area DP-A1. As an example, the resolution of the first area DP-A1 may be about ½, ⅜, ⅓, ¼, 2/9, ⅛, 1/9, or 1/16 of the resolution of the third area DP-A3. For example, the resolution of the third area DP-A3 may be equal to or greater than about 400 pixels per inch (ppi), and the resolution of the first area DP-A1 may be about 200 ppi or about 100 ppi. However, this is merely one example, and the invention should not be limited thereto or thereby. However, an area of the first electrode of the light emitting elements LD1-1 and LD1-2 of the first group may be greater than an area of the first electrode of the light emitting element LD3 of the third group.

In addition, the first pixel circuit PC1 may be disposed not in the first area DP-A1 but in the second area DP-A2 or the peripheral area DP-NA to improve the transmittance of the first area DP-A1 by removing the light blocking structure such as the transistor from the first area DP-A1. An area in which the light emitting elements LD1-1 and LD1-2 of the first group are not disposed in the first area DP-A1 may be defined as a transmission area. As an example, an area in which the first electrode of the light emitting elements LD1-1 and LD1-2 of the first group are not disposed in the first area DP-A1 may be defined as the transmission area.

The number of the light emitting elements LD2 of the second group is smaller than the number of the light emitting elements LD3 of the third group in the unit area to secure an area where the first pixel circuit PC1 is arranged in the second area DP-A2. In the second area DP-A2, the first pixel circuit PC1 may be disposed in an area where the second pixel circuit PC2 is not disposed.

Among the light emitting elements LD1-1 and LD1-2 of the first group, a first light emitting element LD1-1 may be electrically connected to the first pixel circuit PC1 via a first connection line TWL1. Among the light emitting elements LD1-1 and LD1-2 of the first group, a second light emitting element LD1-2 may be electrically connected to the first light emitting element LD1-1 via a second connection line TWL2. Consequently, the second light emitting element LD1-2 may be electrically connected to the first pixel circuit PC1 via the first light emitting element LD1-1. This will be described in detail later.

Each of the first connection line TWL1 and the second connection line TWL2 may overlap the transmission area of the first area DP-A1. Each of the first connection line TWL1 and the second connection line TWL2 may include a transparent conductive material. As an example, each of the first connection line TWL1 and the second connection line TWL2 may include a transparent conductive oxide ("TCO"), such as indium tin oxide ("ITO"), indium zinc oxide ("IZO"), indium gallium zinc oxide ("IGZO"), zinc oxide (ZnO), or indium oxide ($In_2O_3$). The first connection line TWL1 and the second connection line TWL2, which include the transparent conductive material, may not correspond to the light blocking structure.

As an additional pixel circuit to independently drive the second light emitting element LD1-2 is not required and two or more light emitting elements LD1-1 and LD1-2 are driven by the first pixel circuit PC1, a degree of freedom in designing the first area DP-A1 and the second area DP-A2 may be effectively improved, the number of the first connection lines TWL1 overlapping the first area DP-A1 and the second area DP-A2 may be reduced, And the number or area of the first pixel circuits PC1 disposed in the second area DP-A2 may decrease. Thus, a space for the arrangement of the signal lines may be effectively secured.

The second area DP-A2 may be disposed adjacent to the first area DP-A1. The second area DP-A2 may surround at least a portion of the first area DP-A1. The second area DP-A2 may have a transmittance lower than a transmittance of the first area DP-A1. This is because a ratio of an area occupied by the light blocking structure, which is described later, to an entire area is higher in the second area DP-A2 than the corresponding ratio in the first area DP-A1.

As shown in FIG. 5, the second area DP-A2 may be spaced apart from the peripheral area DP-NA, however, the invention should not be limited thereto or thereby. According to another embodiment, the second area DP-A2 may be in contact with the peripheral area DP-NA.

Referring to FIG. 6A, the first pixel circuit PC1, the light emitting element LD2 of the second group, and the second pixel circuit PC2 may be disposed in the second area DP-A2. As the first pixel circuit PC1 is disposed in the second area DP-A2, the area in which the second pixel circuit PC2 is disposed may decrease in the second area DP-A2, and consequently, the resolution of the second area DP-A2 may be lower than the resolution of the third area DP-A3.

In FIG. 6A, a pixel circuit that is not connected to the light emitting element LD2 of the second group in the second area DP-A2 may substantially correspond to the first pixel circuit PC1. The pixel circuit to which nothing is connected in the second area DP-A2 substantially corresponds to the first pixel circuit PC1 that may be connected to the first light emitting device LD1-1 even though the connection is not illustrated in FIG. 6A The third area DP-A3 may be defined adjacent to the second area DP-A2. The third area DP-A3 may have a transmittance lower than a transmittance of the first area DP-A1. The third light emitting element LD3 and the third pixel circuit PC3 may be disposed in the third area DP-A3.

Referring to FIG. 6A, first, second, third, and fourth light emitting element rows PXL1, PXL2, PXL3, and PXL4 may be disposed in the first area DP-A1 and the second area DP-A2. Green light emitting elements for emitting a green light may be arranged in each of the first and third light emitting element rows PXL1 and PXL3 along the first direction DR1.

Blue light emitting elements for emitting a blue light and red light emitting elements for emitting a red light may be alternately arranged with each other in each of the second and fourth light emitting element rows PXL2 and PXL4 along the first direction DR1. In the second direction DR2, the red light emitting elements of the second light emitting element row PXL2 may be aligned with the blue light emitting elements of the fourth light emitting element row PXL4. A first electrode of the blue light emitting elements may have an area greater than an area of a first electrode of the red light emitting elements in a plan view.

Each of the first electrodes arranged in the third area DP-A3 may have an area smaller than an area of each of the first electrodes arranged in the first area DP-A1 and the second area DP-A2. In the third area DP-A3, first to fourth light emitting element rows corresponding to the first to fourth light emitting element rows PXL1 to PXL4 may form one group and may be repeatedly arranged in the second direction DR2.

In FIG. 6B, descriptions will be focused on different features from the display area DP-A shown in FIG. 6A. Referring to FIG. 6B, light emitting elements LD2-1 and LD2-2 of a second group may include a first light emitting element LD2-1 and a second light emitting element LD2-2. The first light emitting element LD2-1 may be electrically connected to a second pixel circuit PC2. The second light emitting element LD2-2 may be electrically connected to the first light emitting element LD2-1 via a connection line TWL2_1. Consequently, the second light emitting element LD2-2 may be electrically connected to the second pixel circuit PC2 via the first light emitting element LD2-1. This will be described in detail later.

Since, to independently drive the second light emitting element LD2-2, another pixel circuit is not further required and two or more light emitting elements LD2-1 and LD2-2 are driven by the second pixel circuit PC2, a degree of freedom in designing the second area DP-A2 may be effectively improved. The number or area of the second pixel circuits PC2 disposed in the second area DP-A2 may effectively decrease.

FIG. 6B shows light emitting elements of a first group including a first light emitting element LD1-1 and a second light emitting element LD1-2 as a representative example, however, the invention should not be limited thereto or thereby. According to another embodiment, the light emitting element of the first group may include only the first light emitting element LD1-1, not the second light emitting element LD1-2.

Figure 7:
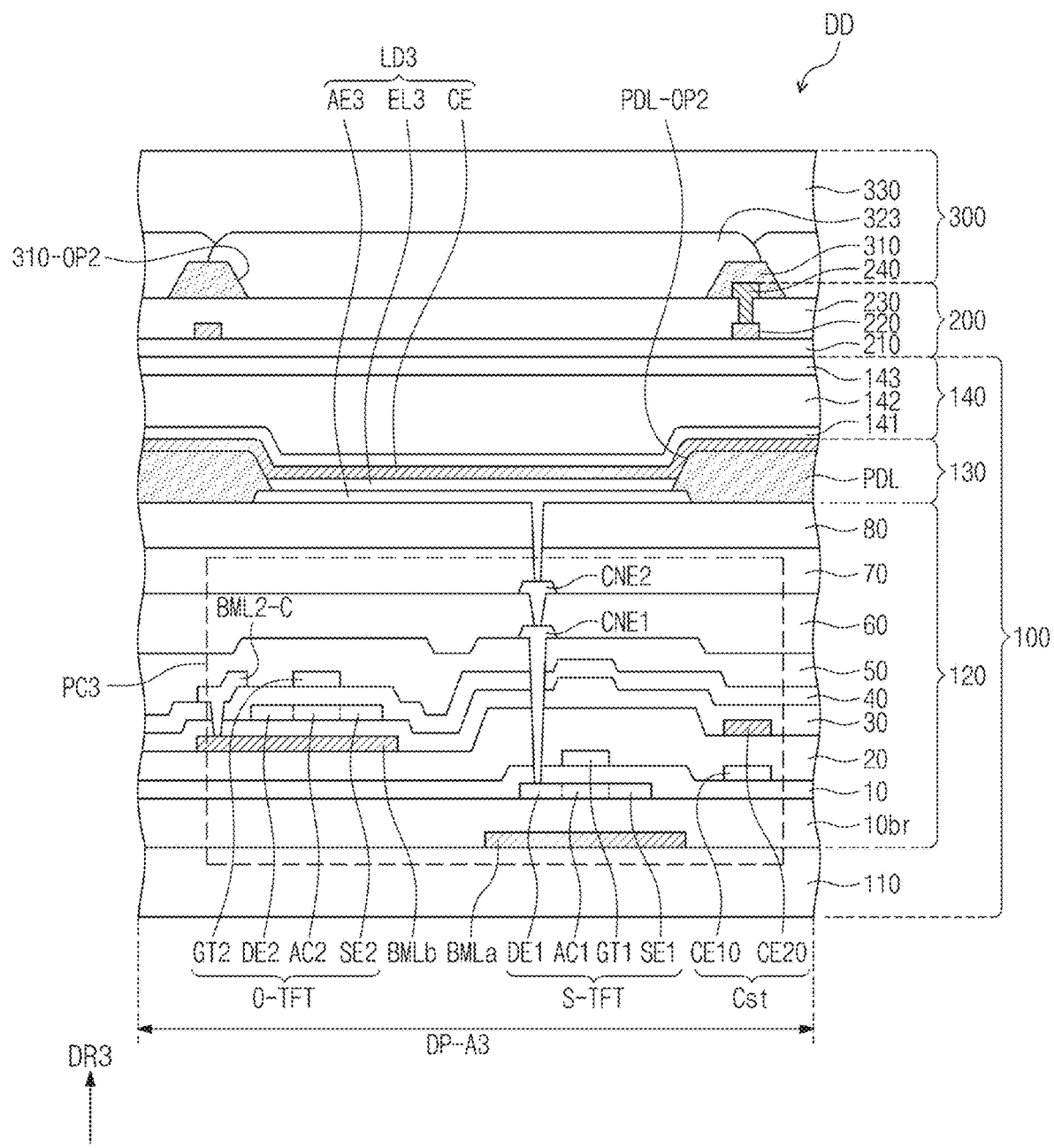
FIG. 7 is a cross-sectional view showing a display device according to an embodiment of the present disclosure.
Figure 8:
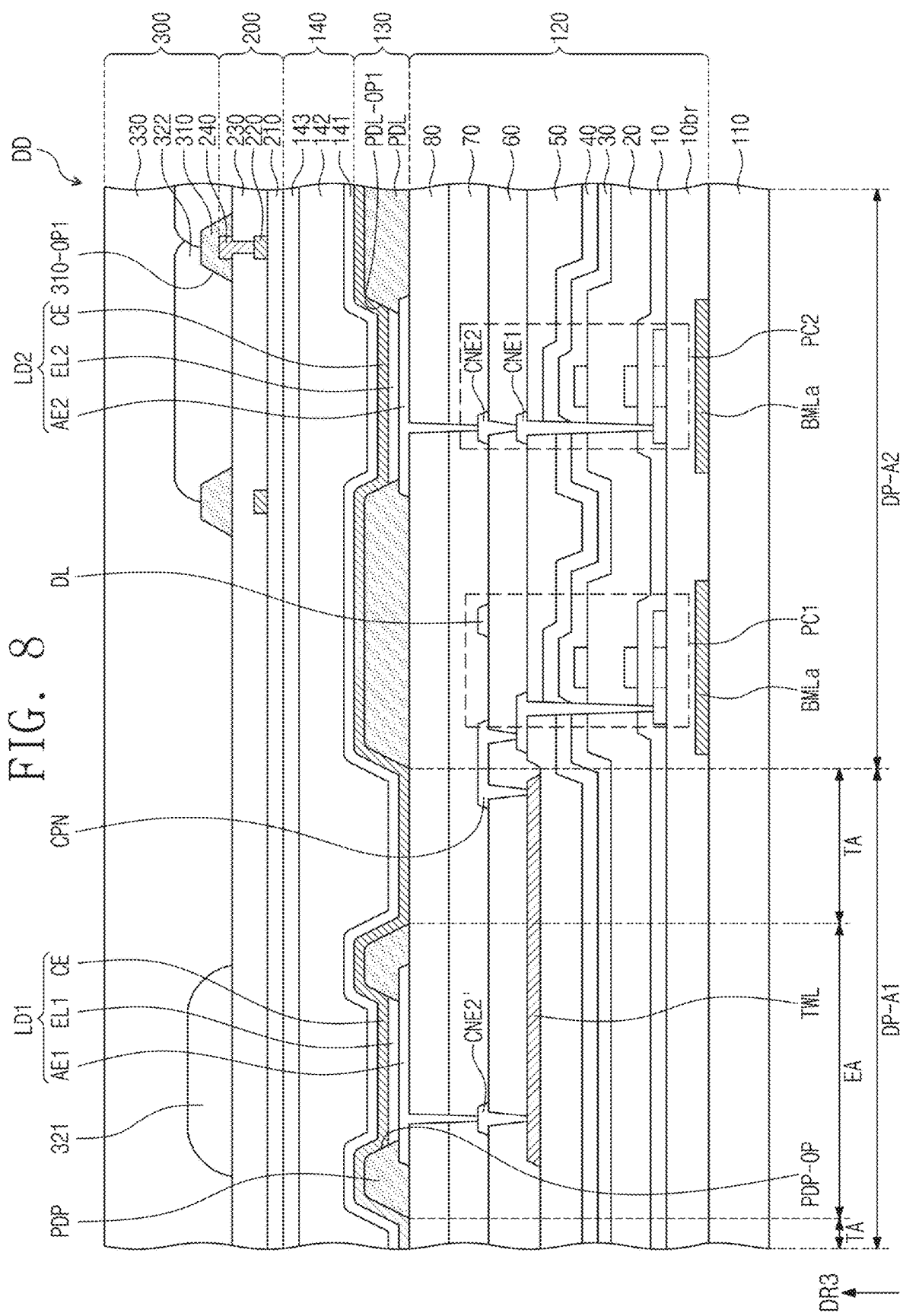
FIG. 8 is a cross-sectional view showing a display device according to an embodiment of the present disclosure.

FIG. 7 is a cross-sectional view showing the display device DD according to an embodiment of the present disclosure. FIG. 8 is a cross-sectional view showing the display device DD according to an embodiment of the present disclosure. FIG. 7 is a cross-sectional view showing the third area DP-A3, and FIG. 8 is a cross-sectional view showing the first area DP-A1 and the second area DP-A2.

FIG. 7 shows the light emitting element LD3 of the third group and a silicon thin film transistor S-TFT and an oxide thin film transistor O-TFT of the third pixel circuit PC3 (refer to FIG. 6A). In the equivalent circuit shown in FIG. 4, the third and fourth thin film transistors T3 and T4 may be the oxide thin film transistor O-TFT, and the other transistors may be the silicon thin film transistor S-TFT. FIG. 8 shows a light emitting element LD1 of the first group, a portion of the first pixel circuit PC1, the light emitting element LD2 of the second group, and a portion of the second pixel circuit PC2. The light emitting element LD1 of the first group shown in FIG. 8 may substantially correspond to the first light emitting element LD1-1 of the first group shown in FIG. 6A. The thin film transistor shown in FIG. 8 may be the sixth thin film transistor T6 shown in FIG. 4.

A buffer layer 10*br* may be disposed on the base layer 110. The buffer layer 10*br* may prevent metal atoms or impurities from being diffused to a first semiconductor pattern from the base layer 110. In addition, the buffer layer 10*br* may control a rate of heat supply during a crystallization process to form the first semiconductor pattern so that the first semiconductor pattern may be uniformly formed.

A first rear surface metal layer BMLa may be disposed under the silicon thin film transistor S-TFT, and a second rear surface metal layer BMLb may be disposed under the oxide thin film transistor O-TFT. The first and second rear surface metal layers BMLa and BMLb may be disposed to overlap the first, second, and third pixel circuits PC1, PC2, and PC3. The first and second rear surface metal layers BMLa and BMLb may prevent an electric potential caused by a polarization phenomenon from exerting influence on the first, second, and third pixel circuits PC1, PC2, and PC3.

The first rear surface metal layer BMLa may be disposed to overlap at least a portion of each of the first, second, and third pixel circuits PC1, PC2, and PC3 (refer to FIG. 6A). The first rear surface metal layer BMLa may be disposed to overlap the driving thin film transistor T1 (refer to FIG. 4) implemented by the silicon thin film transistor S-TFT.

The first rear surface metal layer BMLa may be disposed between the base layer 110 and the buffer layer 10*br*. According to an embodiment, an inorganic barrier layer may be further disposed between the first rear surface metal layer BMLa and the buffer layer 10*br*. The first rear surface metal layer BMLa may be connected to an electrode or a wire and may receive a constant voltage or a signal from the electrode or wire. According to an embodiment, the first rear surface metal layer BMLa may be a floating electrode that is isolated from other electrodes or wire.

The second rear surface metal layer BMLb may be disposed under the oxide thin film transistor O-TFT. The second rear surface metal layer BMLb may be disposed between a second insulating layer 20 and a third insulating layer 30. The second rear surface metal layer BMLb may be disposed on the same layer as the second electrode CE20 of the storage capacitor Cst. The second rear surface metal layer BMLb may be connected to a contact electrode BML2-C to receive a constant voltage or a signal. The contact electrode BML2-C may be disposed on the same layer as a gate GT2 of the oxide thin film transistor O-TFT.

Each of the first rear surface metal layer BMLa and the second rear surface metal layer BMLb may include a reflective metal. As an example, each of the first rear surface metal layer BMLa and the second rear surface metal layer BMLb may include silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), titanium (Ti), p+ doped amorphous silicon, or the like. The first rear surface metal layer BMLa and the second rear surface metal layer BMLb may include the same material or may include different materials.

Although not shown separately, according to an embodiment, the second rear surface metal layer BMLb may be omitted. The first rear surface metal layer BMLa may extend and may be disposed under the oxide thin film transistor O-TFT, and the first rear surface metal layer BMLa may prevent the electric potential caused by the polarization phenomenon from exerting influence on the oxide thin film transistor O-TFT.

The first semiconductor pattern may be disposed on the buffer layer 10*br*. The first semiconductor pattern may include a silicon semiconductor. As an example, the silicon semiconductor may include amorphous silicon or polycrystalline silicon. For example, the first semiconductor pattern may include low temperature polycrystalline silicon.

FIG. 7 shows only a portion of the first semiconductor pattern disposed on the buffer layer 10*br*, and the first semiconductor pattern may be further disposed in other areas. The first semiconductor pattern may be arranged with a specific rule over the pixels. The first semiconductor pattern may have different electrical properties depending on whether it is doped or not or whether it is doped with an N-type dopant or a P-type dopant. The first semiconductor pattern may include a first region having a relatively high conductivity and a second region having a relatively low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or a region doped at a concentration lower than the corresponding concentration of the first region.

The first region may have a conductivity greater than a conductivity of the second region and may substantially serve as an electrode or signal line. The second region may substantially correspond to an active (or a channel) of the transistor. In other words, a portion of the first semiconductor pattern may be the active of the transistor, another portion of the first semiconductor pattern may be a source or a drain of the transistor, and the other portion of the first semiconductor pattern may be a connection electrode or a connection signal line.

A source area SE1 (or a source), an active area AC1 (or a channel), and a drain area DE1 (or a drain) of the silicon thin film transistor S-TFT may be formed from the first semiconductor pattern. The source area SE1 and the drain area DE1 may extend in opposite directions to each other from the active area AC1 in a cross-section.

A first insulating layer 10 may be disposed on the buffer layer 10*br*. The first insulating layer 10 may commonly overlap the pixels and may cover the first semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. In the present embodiment, the first insulating layer 10 may have a single-layer structure of a silicon oxide layer. Not only the first insulating layer 10, but also an insulating layer of the circuit layer 120 described later may be an inorganic layer and/or an organic layer and may have a single-layer or multi-layer structure. The inorganic layer may include at least one of the above-mentioned materials, however, the invention should not be limited thereto or thereby.

A gate GT1 of the silicon thin film transistor S-TFT may be disposed on the first insulating layer 10. The gate GT1 may be a portion of a metal pattern. The gate GT1 may overlap the active area AC1. The gate GT1 may be used as a mask in a process of doping the first semiconductor pattern. The gate GT1 may include titanium (Ti), silver (Ag), an alloy including silver (Ag), molybdenum (Mo), an alloy including molybdenum (Mo), aluminum (Al), an alloy including aluminum (Al), aluminum nitride (AlN), tungsten (W), tungsten nitride (WN), copper (Cu), indium tin oxide (ITO), indium zinc oxide (IZO), or the like, however, it should not be particularly limited.

The second insulating layer 20 may be disposed on the first insulating layer 10 and may cover the gate GT1. The third insulating layer 30 may be disposed on the second insulating layer 20. The second electrode CE20 of the storage capacitor Cst may be disposed between the second insulating layer 20 and the third insulating layer 30. In addition, the first electrode CE10 of the storage capacitor Cst may be disposed between the first insulating layer 10 and the second insulating layer 20.

A second semiconductor pattern may be disposed on the third insulating layer 30. The second semiconductor pattern may include an oxide semiconductor. The oxide semiconductor may include a plurality of areas distinguished from each other depending on whether a metal oxide is reduced. The area (hereinafter, referred to as a "reduced area") in which the metal oxide is reduced has a conductivity greater than a conductivity of the area (hereinafter, referred to as a "non-reduced area") in which the metal oxide is not reduced. The reduced area may act as the source/drain or the signal line. The non-reduced area may substantially correspond to the semiconductor area (or the channel) of the transistor. In other words, a portion of the second semiconductor pattern may be the semiconductor area of the transistor, another portion of the second semiconductor pattern may be the source/drain of the transistor, and the other portion of the second semiconductor pattern may be a signal transmission area.

A source area SE2 (or a source), an active area AC2 (or a channel), and a drain area DE2 (or a drain) of the oxide thin film transistor O-TFT may be formed from the second semiconductor pattern. The source area SE2 and the drain area DE2 may extend in opposite directions to each other from the active area AC2 in a cross-section.

A fourth insulating layer 40 may be disposed on the third insulating layer 30. The fourth insulating layer 40 may commonly overlap the pixels to cover the second semiconductor pattern. The gate GT2 of the oxide thin film transistor O-TFT may be disposed on the fourth insulating layer 40. The gate GT2 of the oxide thin film transistor O-TFT may be a portion of a metal pattern. The gate GT2 of the oxide thin film transistor O-TFT may overlap the active area AC2.

A fifth insulating layer 50 may be disposed on the fourth insulating layer 40 and may cover the gate GT2. A first connection electrode CNE1 may be disposed on the fifth insulating layer 50. The first connection electrode CNE1 may be connected to the drain area DE1 of the silicon thin film transistor S-TFT via a contact hole defined through the first to fifth insulating layers 10 to 50.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 via a contact hole defined through the sixth insulating layer 60. A seventh insulating layer 70 may be disposed on the sixth insulating layer 60 and may cover the second connection electrode CNE2. An eighth insulating layer 80 may be disposed on the seventh insulating layer 70.

Each of the sixth insulating layer 60, the seventh insulating layer 70, and the eighth insulating layer 80 may be an organic layer. As an example, each of the sixth insulating layer 60, the seventh insulating layer 70, and the eighth insulating layer 80 may include a general-purpose polymer such as benzocyclobutene ("BCB"), polyimide, hexamethyldisiloxane ("HMDSO"), polymethylmethacrylate ("PMMA"), or polystyrene ("PS"), a polymer derivative having a phenolic group, an acrylic-based polymer, an imide-based polymer, an aryl ether-based polymer, an amide-based polymer, and a fluorine-based polymer, a p-xylene-based polymer, a vinyl alcohol-based polymer, or blends thereof.

The light emitting element LD1 of the first group may include a first electrode AE1 (or a pixel electrode), a light emitting layer ELL and a second electrode CE (or a common electrode), the light emitting element LD2 of the second group may include a first electrode AE2 (or a pixel electrode), a light emitting layer EL2, and a second electrode CE (or a common electrode), and the light emitting element LD3 of the third group may include a first electrode AE3 (or a pixel electrode), a light emitting layer EL3, and a second electrode CE (or a common electrode). The second electrode CE of the light emitting element LD1 of the first group, the second electrode CE of the light emitting element LD2 of the second group, and the second electrode CE of the light emitting element LD3 of the third group may be integrally provided with each other and may be commonly provided.

The first electrode AE1 of the light emitting element LD1 of the first group, the first electrode AE2 of the light emitting element LD2 of the second group, and the first electrode AE3 of the light emitting element LD3 of the third group may be disposed on the eighth insulating layer 80. Each of the first electrode AE1 of the light emitting element LD1 of the first group, the first electrode AE2 of the light emitting element LD2 of the second group, and the first electrode AE3 of the light emitting element LD3 of the third group may be a semi-transmissive electrode, a transmissive electrode, or a reflective electrode. According to an embodiment, each of the first electrode AE1 of the light emitting element LD1 of the first group, the first electrode AE2 of the light emitting element LD2 of the second group, and the first electrode AE3 of the light emitting element LD3 of the third group may include a reflective layer formed of Ag, Mg, Al, Pt, Pd, Au, Ni, Nd, Ir, Cr, or compounds thereof and a transparent or semi-transparent electrode layer formed on the reflective layer. The transparent or semi-transparent electrode layer may include at least one selected from the group consisting of indium tin oxide (ITO), indium zinc oxide (IZO), indium gallium zinc oxide (IGZO), zinc oxide (ZnO), indium oxide ($In_2O_3$), and aluminum-doped zinc oxide ("AZO"). For instance, each of the first electrode AE1 of the light emitting element LD1 of the first group, the first electrode AE2 of the light emitting element LD2 of the second group, and the first electrode AE3 of the light emitting element LD3 of the third group may include a stack structure of ITO/Ag/ITO.

A pixel definition layer PDL and a pixel definition pattern PDP may be disposed on the eighth insulating layer 80. The pixel definition layer PDL and the pixel definition pattern PDP may include the same material and may be formed through the same process. Each of the pixel definition layer PDL and the pixel definition pattern PDP may have a light absorbing property, for example, each of the pixel definition layer PDL and the pixel definition pattern PDP may have a black color. Each of the pixel definition layer PDL and the pixel definition pattern PDP may include a black coloring agent. The black coloring agent may include a black dye or a black pigment. The black coloring agent may include a metal material, such as carbon black, chromium, or an oxide thereof. Each of the pixel definition layer PDL and the pixel definition pattern PDP may correspond to a light blocking pattern having a light blocking property.

The pixel definition pattern PDP may be disposed in the first area DP-A1. The pixel definition pattern PDP may cover a portion of the first electrode AE1 of the light emitting element LD1 of the first group. As an example, the pixel definition pattern PDP may cover an edge of the first electrode AE1 of the light emitting element LD1 of the first group.

The pixel definition layer PDL may be disposed in the second area DP-A2 and the third area DP-A3. The pixel definition layer PDL may cover a portion of each of the first electrode AE2 of the light emitting element LD2 of the second group and the first electrode AE3 of the light emitting element LD3 of the third group. As an example, the pixel definition layer PDL may be provided with a first opening PDL-OP1 defined therethrough to expose a portion of the first electrode AE2 of the light emitting element LD2 of the second group and a second opening PDL-OP2 defined therethrough to expose a portion of the first electrode AE3 of the light emitting element LD3 of the third group.

The pixel definition pattern PDP may increase a distance between an edge of the first electrode AE1 of the light emitting element LD1 of the first group and the second electrode CE, and the pixel definition layer PDL may increase a distance between an edge of each of the first electrode AE2 of the light emitting element LD2 of the second group and an edge of the first electrode AE3 of the light emitting element LD3 of the third group and the second electrode CE. Accordingly, an occurrence of arc on the edge of each of the first electrodes AE1, AE2, and AE3 may be prevented by the pixel definition pattern PDP and the pixel definition layer PDL.

In the first area DP-A1, an area overlapping an area in which the first electrode AE1 of the light emitting element LD1 of the first group and the pixel definition pattern PDP are disposed may be defined as an element area EA, and the other area may be defined as a transmission area TA.

The first electrode AE1 of the light emitting element LD1 of the first group may be electrically connected to the first pixel circuit PC1 disposed in the second area DP-A2. As an example, the first electrode AE1 of the light emitting element LD1 of the first group may be electrically connected to the first pixel circuit PC1 via a connection line TWL and connection electrodes CNE1' and CPN. In this case, the connection line TWL may overlap the transmission area TA. Accordingly, the connection line TWL may include a light transmissive material. According to an embodiment, the connection electrode CPN may be omitted, and the connection line TWL may be directly connected to a conductive pattern of the first pixel circuit PC1.

The first electrode AE1 of the light emitting element LD1 of the first group shown in FIG. 8 may be the first electrode of the first light emitting element LD1-1 shown in FIG. 6A. The connection line TWL shown in FIG. 8 may be the first connection line TWL1 shown in FIG. 6A.

The connection line TWL may be disposed between the fifth insulating layer 50 and the sixth insulating layer 60, however, it should not be particularly limited. The connection electrodes CNE2' and CPN may be disposed between the sixth insulating layer 60 and the seventh insulating layer 70.

The light emitting layer EL1 of the light emitting element LD1 of the first group may be disposed on the first electrode AE1 of the light emitting element LD1 of the first group, the light emitting layer EL2 of the light emitting element LD2 of the second group may be disposed on the first electrode AE2 of the light emitting element LD2 of the second group, and the light emitting layer EL3 of the light emitting element LD3 of the third group may be disposed on the first electrode AE3 of the light emitting element LD3 of the third group. In the present embodiment, each of the light emitting layers ELL EL2, and EL3 may emit a light having at least one color among blue, red, and green colors.

The second electrode CE may be commonly disposed on the light emitting layers ELL EL2, and EL3. The second electrode CE may have an integral shape and may be commonly disposed over the pixels PX (refer to FIG. 5).

Although not shown in figures, a hole control layer may be disposed between the first electrodes AE1, AE2, and AE3 and the light emitting layers ELL EL2, and EL3. The hole control layer may include a hole transport layer and may further include a hole injection layer. An electron control layer may be disposed between the light emitting layers ELL EL2, and EL3 and the second electrode CE. The electron control layer may include an electron transport layer and may further include an electron injection layer. The hole control layer and the electron control layer may be commonly formed over the plural pixels PX (refer to FIG. 5) using an open mask.

The encapsulation layer 140 may be disposed on the light emitting element layer 130. The encapsulation layer 140 may include an inorganic layer 141, an organic layer 142, and an inorganic layer 143, which are sequentially stacked, however, layers included in the encapsulation layer 140 according to the invention should not be limited thereto or thereby.

The inorganic layers 141 and 143 may protect the light emitting element layer 130 from moisture and oxygen, and the organic layer 142 may protect the light emitting element layer 130 from a foreign substance such as dust particles. The inorganic layers 141 and 143 may include a silicon nitride layer, a silicon oxynitride layer, a silicon oxide layer, a titanium oxide layer, or an aluminum oxide layer. The organic layer 142 may include an acrylic-based organic layer, however, the invention should not be limited thereto or thereby.

The sensor layer 200 may be disposed on the display panel 100. The sensor layer 200 may be referred to as a sensor, an input sensing layer, or an input sensing panel. The sensor layer 200 may include a base layer 210, a first conductive layer 220, a sensing insulating layer 230, and a second conductive layer 240.

The base layer 210 may be disposed on the display panel 100. The base layer 210 may be an inorganic layer including at least one of silicon nitride, silicon oxynitride, and silicon oxide. According to an embodiment, the base layer 210 may be an organic layer including an epoxy resin, an acrylic resin, or an imide-based resin. The base layer 210 may have a single-layer structure or a multi-layer structure of layers stacked in the third direction DR3.

Each of the first conductive layer 220 and the second conductive layer 240 may have a single-layer structure or a multi-layer structure of layers stacked in the third direction DR3. The first conductive layer 220 and the second conductive layer 240 may include conductive lines to define sensing electrodes having a mesh shape. The conductive lines may not overlap the first opening PDL-OP1, the second opening PDL-OP2, and openings PDP-OP1 and PDP-OP2 in a plan view and may overlap the pixel definition pattern PDP and the pixel definition layer PDL. The sensing electrodes defined by the first conductive layer 220 and the second conductive layer 240 may overlap at least the third area DP-A3 shown in FIG. 5.

The conductive layer having the single-layer structure may include a metal layer or a transparent conductive layer. The metal layer may include molybdenum, silver, titanium, copper, aluminum, or alloys thereof. The transparent conductive layer may include a transparent conductive oxide, such as indium tin oxide (ITO), indium zinc oxide (IZO), zinc oxide (ZnO), indium zinc tin oxide (ITZO), or the like. In addition, the transparent conductive layer may include conductive polymer such as PEDOT, metal nanowire, graphene, or the like.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

The sensing insulating layer 230 may be disposed between the first conductive layer 220 and the second conductive layer 240. The sensing insulating layer 230 may include an inorganic layer. The inorganic layer may include at least one of aluminum oxide, titanium oxide, silicon oxide, silicon nitride, silicon oxynitride, zirconium oxide, and hafnium oxide.

According to an embodiment, the sensing insulating layer 230 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

The anti-reflective layer 300 may be disposed on the sensor layer 200. The anti-reflective layer 300 may include a division layer 310, a first color filter 321, a second color filter 322, a third color filter 323, and a planarization layer 330.

Materials for the division layer 310 should not be particularly limited as long as the materials absorb a light. The division layer 310 may have a black color and may have a black coloring agent. The black coloring agent may include a black dye or a black pigment. The black coloring agent may include a metal material, such as carbon black, chromium, or an oxide thereof.

The division layer 310 may cover the second conductive layer 240 of the sensor layer 200. The division layer 310 may prevent the external light from being reflected by the second conductive layer 240. The division layer 310 may overlap the second area DP-A2 and the third area DP-A3 and may not overlap the first area DP-A1 in a plan view. That is, as the division layer 310 is not disposed in the first area DP-A1, the transmittance of the first area DP-A1 may be effectively improved.

The division layer 310 may be provided with a plurality of openings 310-OP1 and 310-OP2 defined therethrough. A first opening 310-OP1 may overlap the first electrode AE2 of the light emitting element LD2 of the second group, and a second opening 310-OP2 may overlap the first electrode AE3 of the light emitting element LD3 of the third group.

The first color filter 321 may overlap the first area DP-A1, the second color filter 322 may overlap the second area DP-A2, and the third color filter 323 may overlap the third area DP-A3. Each of the first color filter 321, the second color filter 322, and the third color filter 323 may overlap a corresponding electrode among the first electrodes AE1, AE2, and AE3.

Since the division layer 310 does not overlap the first area DP-A1, the first color filter 321 may be spaced apart from the division layer 310. That is, the first color filter 321 may not be in contact with the division layer 310. The second color filter 322 may cover the first opening 310-OP1, and the third color filter 323 may cover the second opening 310-OP2. Each of the second color filter 322 and the third color filter 323 may be in contact with the division layer 310. An opening size of each of the first and second openings 310-OP1 and 310-OP2 may be greater than an opening size of each of the first and second openings PDL-OP1 and PDL-OP2 of the pixel definition layer PDL.

The planarization layer 330 may cover the division layer 310, the first color filter 321, the second color filter 322, and the third color filter 323. The planarization layer 330 may include an organic material and may provide a flat surface thereon. According to an embodiment, the planarization layer 330 may be omitted.

Figure 9:
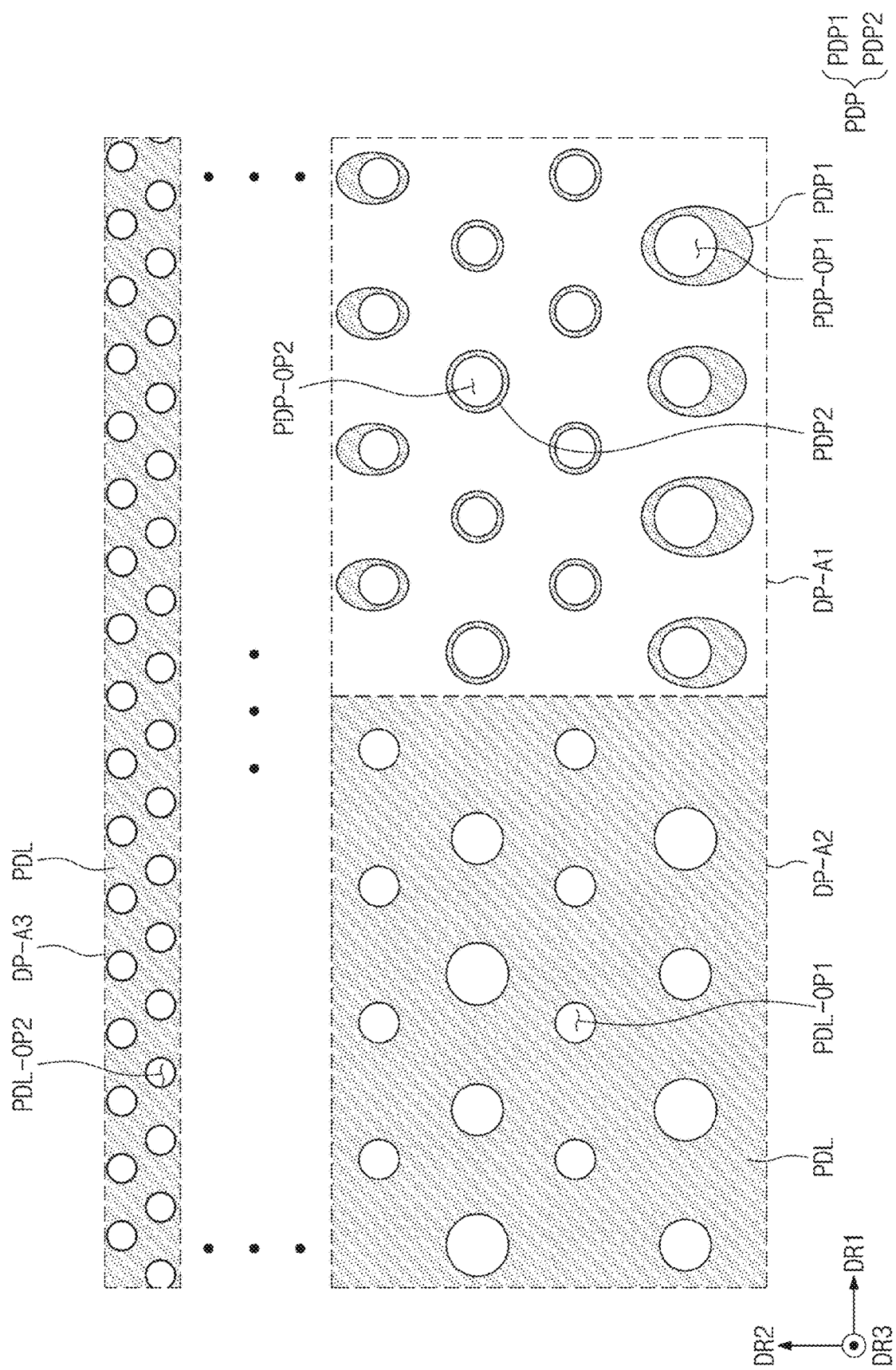
FIG. 9 is a plan view showing a pixel definition layer and a pixel definition pattern according to an embodiment of the present disclosure.

FIG. 9 is a plan view showing the pixel definition layer PDL and the pixel definition pattern PDP according to an embodiment of the present disclosure. In detail, FIG. 9 shows the pixel definition layer PDL and the pixel definition pattern PDP, which are disposed to correspond to the area AA' of FIG. 5.

Referring to FIG. 9, the pixel definition layer PDL may be disposed in the second area DP-A2 and the third area DP-A3. The pixel definition layer PDL may not overlap the first area DP-A1. Since the pixel definition layer PDL having the black color is not disposed in the first area DP-A1, the transmittance of the first area DP-A1 may be effectively improved.

The pixel definition pattern PDP may be disposed in the first area DP-A1. The pixel definition pattern PDP may be provided in plural, and the pixel definition patterns PDP may be disposed to be spaced apart from each other. The pixel definition patterns PDP may be provided with the openings PDP-OP1 and PDP-OP2 defined therethrough. The openings PDP-OP1 and PDP-OP2 may overlap the first electrode AE1. As an example, each of the pixel definition patterns PDP may have a shape that covers an edge of a corresponding first electrode AE1 (refer to FIG. 8). Accordingly, the pixel definition pattern PDP may have a ring shape or a donut shape when viewed in a plane (i.e., in a plan view).

In the second area DP-A2, the first openings PDL-OP1 may be provided in plural, and the first openings PDL-OP1 may be arranged in a specific rule. The arrangement of the first openings PDL-OP1 may be determined depending on a color arrangement of the pixels. FIG. 9 shows three types of first openings PDL-OP1 distinguished from each other according to sizes thereof as a representative example. This means that the pixels generating three colors are arranged. The three type of pixels may include a red pixel, a green pixel, and a blue pixel.

The pixel definition pattern PDP may include a first pixel definition pattern PDP1 and a second pixel definition pattern PDP2 having a shape different from that of the first pixel definition pattern PDP1. A first group of the first pixel definition pattern PDP1 and the second pixel definition pattern PDP2 may correspond to the red pixel, a second group of the first pixel definition pattern PDP1 and the second pixel definition pattern PDP2 may correspond to the green pixel, and a third group of the first pixel definition pattern PDP1 and the second pixel definition pattern PDP2 may correspond to the blue pixel. The openings PDP-OP1 of the first pixel definition patterns PDP1 of the first to third groups may have different sizes from each other. The openings PDP-OP2 of the second pixel definition patterns PDP2 of the first to third group may have different sizes from each other.

Figure 10A:
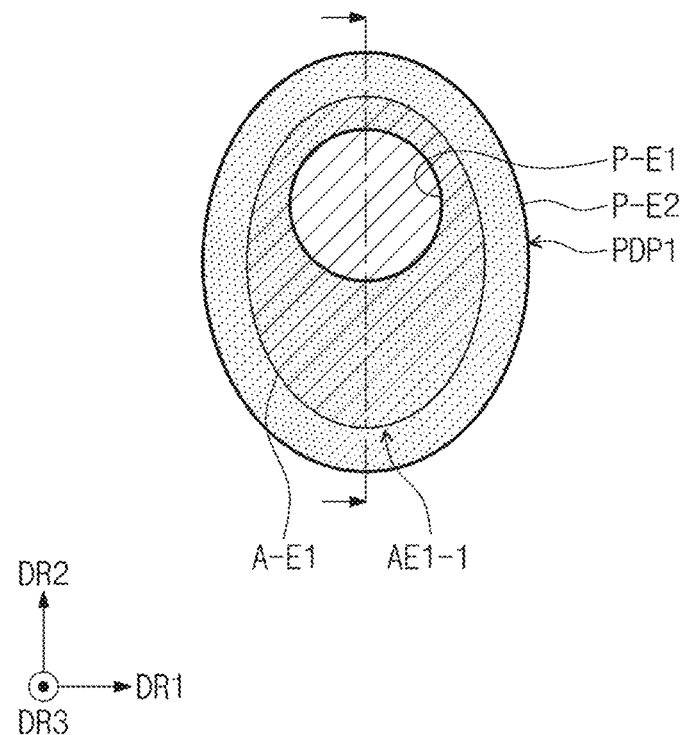
FIG. 10A is a plan view showing some components of a display device according to an embodiment of the present disclosure.
Figure 10B:
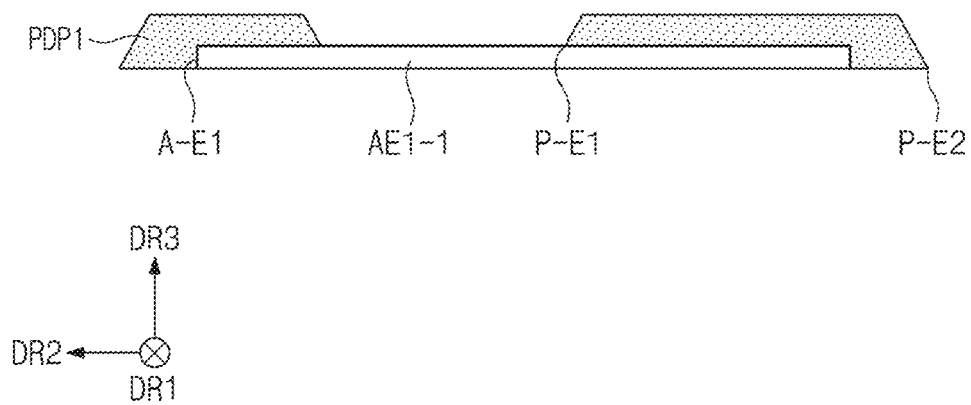
FIG. 10B is a cross-sectional view showing the some components of FIG. 10A.
Figure 10C:
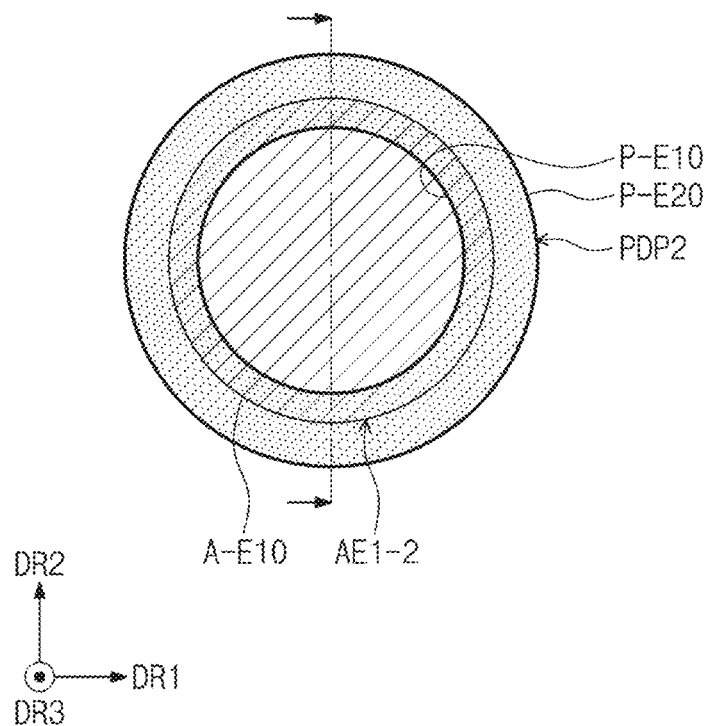
FIG. 10C is a plan view showing some components of a display device according to another embodiment of the present disclosure.
Figure 10D:
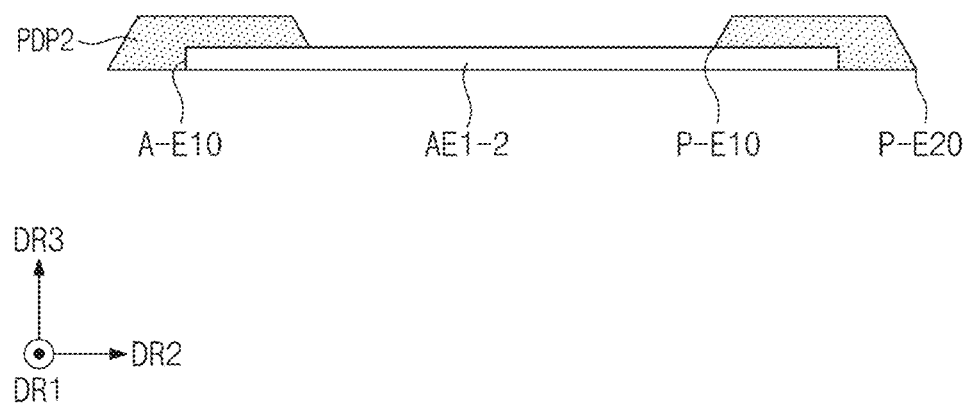
FIG. 10D is a cross-sectional view showing the some components of FIG. 10C.
Figure 10E:
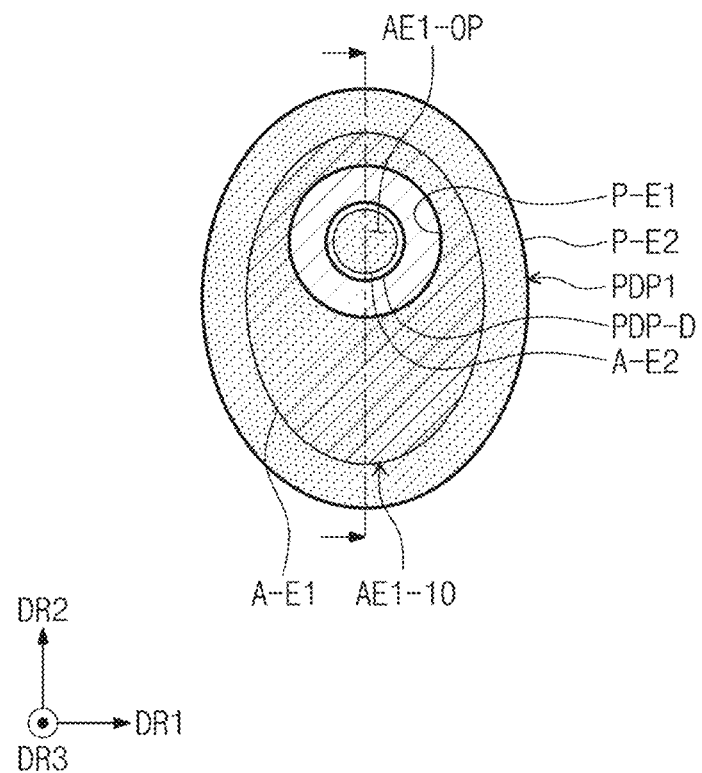
FIG. 10E is a plan view showing some components of a display device according to still another embodiment of the present disclosure.
Figure 10F:
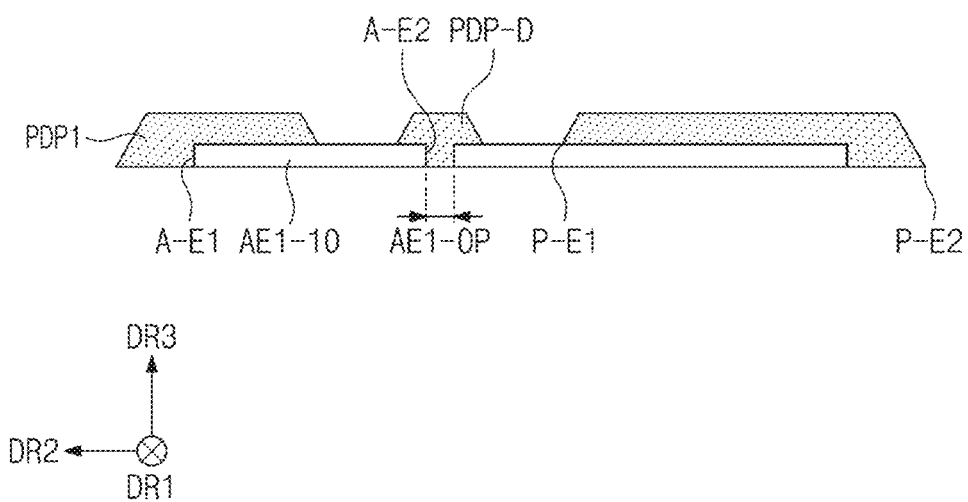
FIG. 10F is a cross-sectional view showing the some components of FIG. 10E.
Figure 10G:
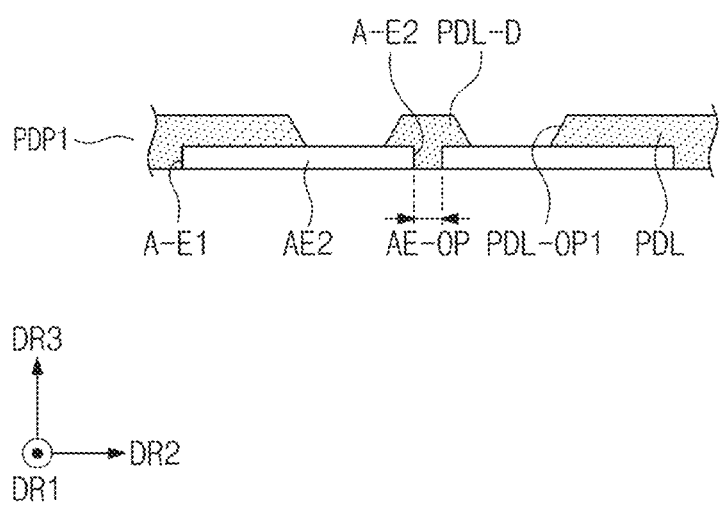
FIG. 10G is a cross-sectional view showing some components of a display device according to an embodiment of the present disclosure.

FIG. 10A is a plan view showing some components of a display device according to an embodiment of the present disclosure. FIG. 10B is a cross-sectional view showing the some components of FIG. 10A. FIG. 10C is a plan view showing some components of a display device according to another embodiment of the present disclosure. FIG. 10D is a cross-sectional view showing the some components of FIG. 10C. FIG. 10E is a plan view showing some components of a display device according to still another embodiment of the present disclosure. FIG. 10F is a cross-sectional view showing the some components of FIG. 10E. FIG. 10G is a cross-sectional view showing some components of a display device according to an embodiment of the present disclosure.

FIGS. 10A and 10B show a first electrode AE1-1 (hereinafter, referred to as a first pixel electrode) of the first light emitting element LD1-1 shown in FIG. 6A and the first pixel definition pattern PDP1 corresponding to the first pixel electrode AE1-1. The first pixel electrode AE1-1 may include a curved edge A-E1. The first pixel electrode AE1-1 may have an oval shape in a plane (i.e., in a plan view). The shape of the first pixel electrode AE1-1 may be defined by the edge A-E1. Due to the first pixel electrode AE1-1 having the above-mentioned shape, a diffraction of a light passing through the transmission area TA (refer to FIG. 8) may be reduced.

The first pixel definition pattern PDP1 may cover the edge A-E1 of the first pixel electrode AE1-1. The first pixel definition pattern PDP1 may include a first edge P-E1 that overlaps the first pixel electrode AE1-1 and a second edge P-E2 that does not overlap the first pixel electrode AE1-1. Each of the first edge P-E1 of the first pixel definition pattern PDP and the second edge P-E2 of the first pixel definition pattern PDP may include a curve. The second edge P-E2 may surround the first edge P-E1 in a plan view. The first edge P-E1 may define an opening PDP-OP. The first pixel definition pattern PDP1 may be a light blocking pattern and a ring pattern.

FIGS. 10C and 10D show a first electrode AE1-2 (hereinafter, referred to as a second pixel electrode) of the second light emitting element LD1-2 shown in FIG. 6A and the second pixel definition pattern PDP2 corresponding to the second pixel electrode AE1-2. The second pixel definition pattern PDP2 may be a light blocking pattern and a ring pattern.

The second pixel electrode AE1-2 may include a curved edge A-E10. The second pixel electrode AE1-2 may have a circular shape when viewed in a plane (in a plan view). The shape of the second pixel electrode AE1-2 may be defined by the edge A-E10. Due to the second pixel electrode AE1-2 having the above-mentioned shape, a diffraction of a light passing through the transmission area TA (refer to FIG. 8) may be reduced. However, the second pixel electrode AE1-2 may have an area smaller than an area of the first pixel electrode AE1-1.

The second pixel definition pattern PDP2 may cover the edge A-E10 of the second pixel electrode AE1-2. The second pixel definition pattern PDP2 may include a first edge P-E10 that overlaps the second pixel electrode AE1-2 and a second edge P-E20 that does not overlap the second pixel electrode AE1-2 in a plan view. Each of the first edge P-E10 of the second pixel definition pattern PDP and the second edge P-E20 of the second pixel definition pattern PDP may include a curve.

The second edge P-E20 may surround the first edge P-E10. The first edge P-E10 may define an opening PDP-OP. The first edge P-E10 may define the opening PDP-OP having the same shape as that of the first edge P-E1 shown in FIG. 10A.

FIGS. 10E and 10F show a first pixel electrode AE1-10 having a shape different from the shape of the first pixel electrode AE1-1 described with reference to FIG. 10A. According to the present embodiment, the first pixel electrode AE1-10 may be provided with an opening AE1-OP defined therethrough. The opening AE1-OP may be defined by an inner edge A-E2. An outer edge A-E1 may correspond to the edge A-E1 of FIG. 10A.

Since the first pixel electrode AE1-10 has a relatively large area, gases generated under the first pixel electrode AE1-10 during a manufacturing process of the display panel may be collected in the first pixel electrode AE1-10. The opening AE1-OP may be formed as a discharge passage for the gases to prevent the above phenomenon.

A dummy pattern PDP-D is disposed to overlap the opening AE1-OP. The dummy pattern PDP-D may overlap the inner edge A-E2. The dummy pattern PDP-D may include the same material as that of the first pixel definition pattern PDP1. The dummy pattern PDP-D may be a light blocking pattern like the first pixel definition pattern PDP1. The dummy pattern PDP-D may be a dot pattern.

Although not shown separately, the shape of the second pixel electrode AE1-2 described with reference to FIG. 10C may also be changed to the shape shown in FIGS. 10E and 10F. In addition, the dummy pattern may be disposed to overlap the opening of the second pixel electrode AE1-2.

The shape of the first electrode AE2 described with reference to FIGS. 6A and 8 may also be changed to a shape shown in FIG. 10E. The changed shape of the first electrode AE2 of FIG. 8 is shown in FIG. 10G. In addition, the dummy pattern PDL-D may be disposed to overlap an opening AE-OP of the first electrode AE2.

Figure 11:
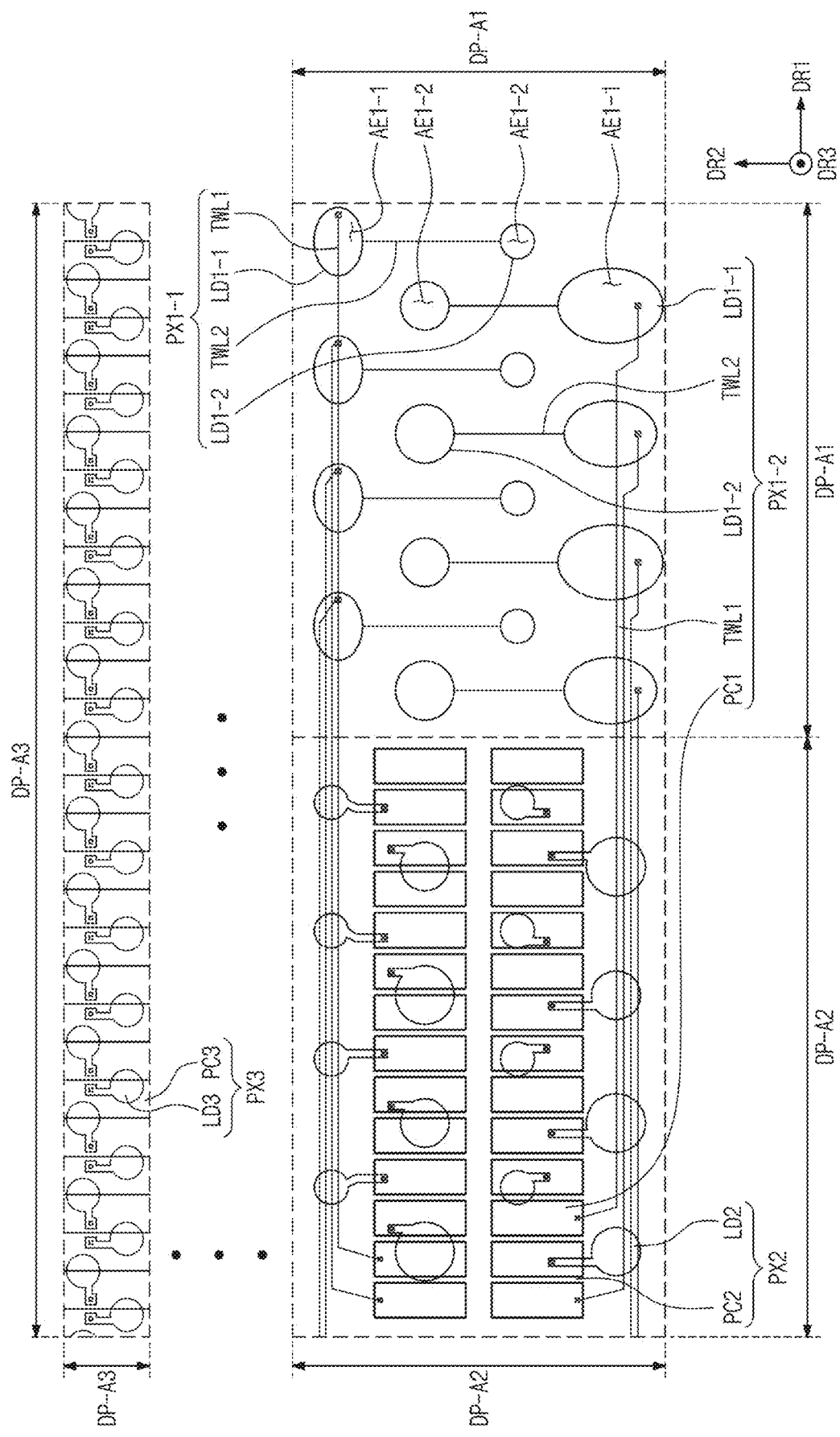
FIG. 11 is an enlarged plan view showing an area AA' of FIG. 5.

FIG. 11 is an enlarged plan view showing an area AA' of FIG. 5. In FIG. 11, descriptions will be focused on different features from the first area DP-A1 shown in FIG. 6A.

A first pixel electrode AE1-1 of a first pixel PX1-1, which is closest to a third pixel PX3, has a different arrangement from the arrangement of a first pixel electrode AE1-1 of a first pixel PX1-2, which is not closest to the third pixel PX3. A major axis (i.e., longitudinal axis) of the first pixel electrode AE1-1 of the first pixel PX1-1 closest to the third pixel PX3 may be substantially parallel to a direction DR1 in which the third pixels PX3 are arranged. This is to secure a sufficient space between the first pixel electrode AE1-1 of the first pixel PX1-1 closest to the third pixel PX3 and a pixel electrode of a light emitting element LD3 of a third group.

On the other hand, the major axis (i.e., longitudinal axis) of the first pixel electrode AE1-1 of another first pixel PX1-2, which is not closest to the third pixel PX3, may be substantially parallel to the other direction DR2.

Figure 12A:
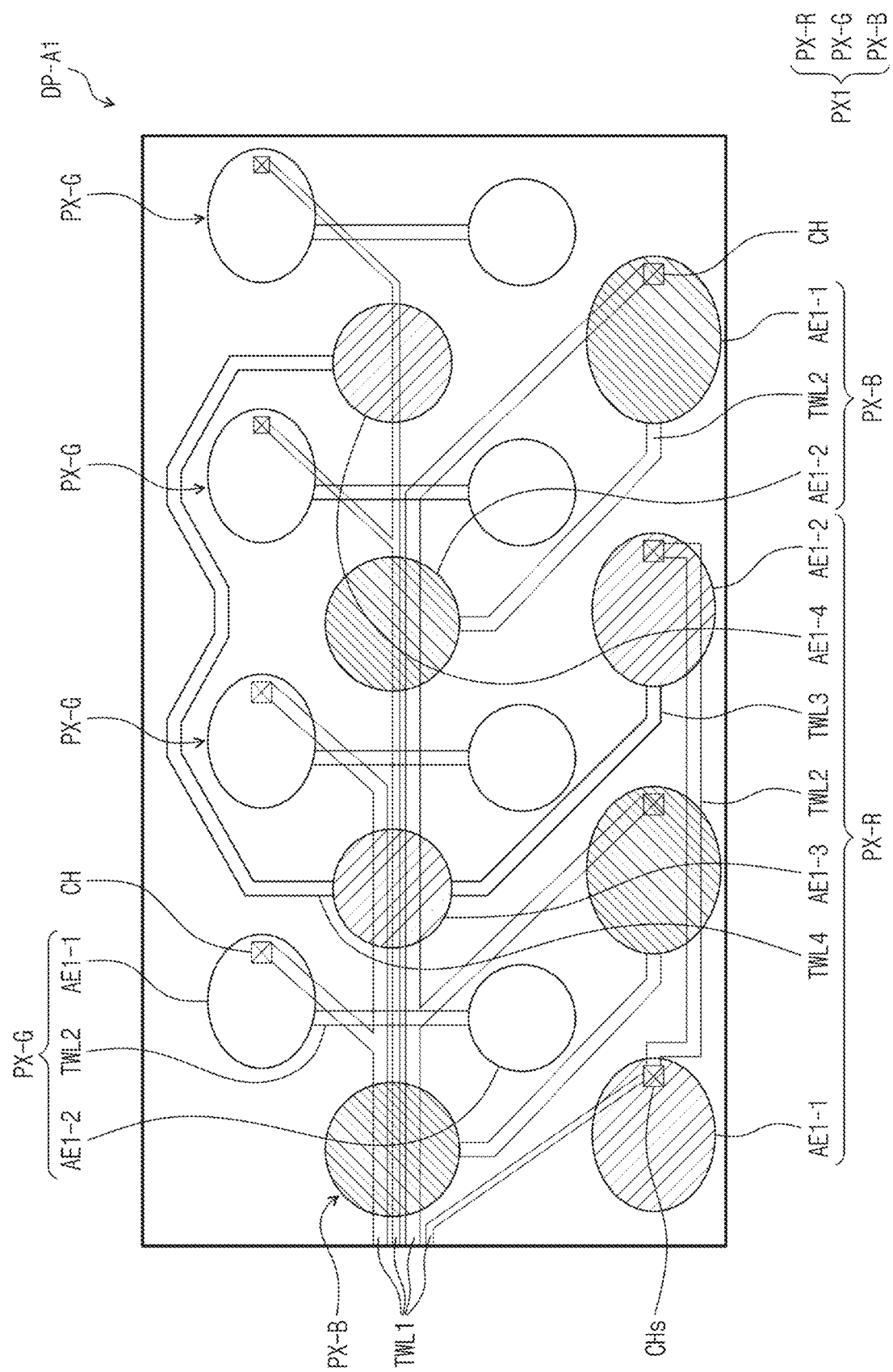
FIG. 12A is a plan view showing a first area according to an embodiment of the present disclosure.

FIG. 12A is a plan view showing a first area DP-A1 according to an embodiment of the present disclosure. FIG.

12B is a plan view showing a first area DP-A1 according to another embodiment of the present disclosure.

FIG. 12A shows the first pixel PX1 described with reference to FIGS. 5 to 9 in detail. The first pixel PX1 may include a first color pixel PX-R, a second color pixel PX-G, and a third color pixel PX-B. In the present embodiment, the first color pixel PX-R may be a red pixel, the second color pixel PX-G may be a green pixel, and the third color pixel PX-B may be a blue pixel.

FIG. 12A shows one first color pixel PX-R, four second color pixels PX-G, and two third color pixels PX-B as a representative example. As described above, since the pixel circuit of each of the first color pixel PX-R, the second color pixel PX-G, and the third color pixel PX-B is not disposed in the first area DP-A1, the pixel circuit is not shown in FIG. 12A.

Each of the first color pixel PX-R, the second color pixel PX-G, and the third color pixel PX-B may include two or more light emitting elements connected to each other in parallel. Each of a first pixel electrode AE1-1, a second pixel electrode AE1-2, a third pixel electrode AE1-3, and a fourth pixel electrode AE1-4 represents a light emitting element. The light emitting layer EL1 and the second electrode CE, which are shown in FIG. 8, may be disposed on the pixel electrodes AE1-1, AE1-2, AE1-3, and AE1-4.

The first pixel electrode AE1-1 of each of the first color pixel PX-R, the second color pixel PX-G, and the third color pixel PX-B may be connected to the first connection line TWL1. Considering the area occupied by contact holes CH and CHs, the first pixel electrode AE1-1 may have an area larger than an area of the pixel electrode that does not overlap the contact hole CH, for example, the second pixel electrode AE1-2 or the third pixel electrode AE1-3 in a plan view. The first connection line TWL1 may correspond to the connection line TWL shown in FIG. 8.

In FIG. 12A, a first type contact hole CH may indicate a path through which the first connection line TWL1 is directly connected to the first pixel electrode AE1-1, and a second type contact hole CHs may indicate a path through which the first connection line TWL1 is connected to the first pixel electrode AE1-1 via the connection electrode CNE2' (refer to FIG. 8). The connection electrode CNE2' may be a portion of the second connection line TWL2 described later.

The first connection lines TWL1 of the first color pixel PX-R, the second color pixel PX-G, and the third color pixel PX-B may be disposed on the same layer, however, the invention should not be limited thereto or thereby. When the first connection line TWL1 connected to the first color pixel PX-R among the first color pixel PX-R, the second color pixel PX-G, and the third color pixel PX-B is the connection line TWL shown in FIG. 8, the first connection line TWL1 connected to the third color pixel PX-B among the first color pixel PX-R, the second color pixel PX-G, and the third color pixel PX-B may be disposed between the sixth insulating layer 60 and the seventh insulating layer 70 of FIG. 8 or between the seventh insulating layer 70 and the eighth insulating layer 80 of FIG. 8.

When the first connection line TWL1 connected to two second color pixels PX-G at a left side among the four second color pixels PX-G is the connection line TWL shown in FIG. 8, the first connection line TWL1 connected to two second color pixels PX-G at a right side among the four second color pixels PX-G may be disposed between the sixth insulating layer 60 and the seventh insulating layer 70 of FIG. 8 or between the seventh insulating layer 70 and the eighth insulating layer 80 of FIG. 8.

When the first connection line TWL1 connected to some of the second color pixels PX-G is the connection line TWL shown in FIG. 8, the first connection line TWL1 connected to the other of the second color pixels PX-G may be disposed between the sixth insulating layer 60 and the seventh insulating layer 70 of FIG. 8 or between the seventh insulating layer 70 and the eighth insulating layer 80 of FIG. 8.

The first color pixel PX-R may include a first light emitting element, second a light emitting element, a third light emitting element, and a fourth light emitting element. In FIG. 12A, the first pixel electrode AE1-1, the second pixel electrode AE1-2, the third pixel electrode AE1-3, and the fourth pixel electrode AE1-4 are shown as a representative example of the first light emitting element, the second light emitting element, the third light emitting element, and the fourth light emitting element, respectively. The second connection line TWL2 may connect the first pixel electrode AE1-1 and the second pixel electrode AE1-2. The second connection line TWL2 may be disposed on a layer different from a layer on which the first connection line TWL1 connected to the first pixel electrode AE1-1 is disposed. When the first connection line TWL1 connected to the first pixel electrode AE1-1 is the connection line TWL shown in FIG. 8, the second connection line TWL2 may be disposed between the sixth insulating layer 60 and the seventh insulating layer 70 of FIG. 8 or between the seventh insulating layer 70 and the eighth insulating layer 80 of FIG. 8.

One of the first connection line TWL1 and the second connection line TWL2 may be directly connected to the first pixel electrode AE1-1. A connection electrode may be further disposed between one of the first connection line TWL1 and the second connection line TWL2 and the first pixel electrode AE1-1.

The second connection line TWL2 may be directly connected to the first pixel electrode AE1-1 or the second pixel electrode AE1-2 via a contact hole defined through the insulating layer disposed on the second connection line TWL2. For instance, the second connection line TWL2 may be directly connected to the first pixel electrode AE1-1 or the second pixel electrode AE1-2 via a contact hole defined through the seventh insulating layer 70 and the eighth insulating layer 80 of FIG. 8 or via a contact hole defined through the eighth insulating layer 80 of FIG. 8.

A third connection line TWL3 may connect the second pixel electrode AE1-2 and the third pixel electrode AE1-3. The third connection line TWL3 may be disposed on the same layer as the second pixel electrode AE1-2 and the third pixel electrode AE1-3. The third connection line TWL3 may include the transparent conductive material as does the first connection line TWL1.

Either one of the second pixel electrode AE1-2 and the third connection line TWL3 may be first formed on the eighth insulating layer 80 (refer to FIG. 8), and then the other one may be continuously formed. Different from the embodiment shown in FIG. 12A, the third connection line TWL3 may overlap each of the second pixel electrode AE1-2 and the third pixel electrode AE1-3.

A fourth connection line TWL4 may connect the third pixel electrode AE1-3 and the fourth pixel electrode AE1-4. The fourth connection line TWL4 may include the same material as the third connection line TWL3 and may be formed through the same process as the third connection line TWL3. The fourth connection line TWL4 may overlap each of the third pixel electrode AE1-3 and the fourth pixel electrode AE1-4.

Each of the second color pixel PX-G and the third color pixel PX-B may include the first pixel electrode AE1-1 and the second pixel electrode AE1-2. The second connection line TWL2 may connect the first pixel electrode AE1-1 and the second pixel electrode AE1-2. The second connection line TWL2 may be disposed on the same layer as the first pixel electrode AE1-1 and the second pixel electrode AE1-2. The second connection line TWL2 may include the transparent conductive material as does the first connection line TWL1. The second connection line TWL2 may be formed through the same process as the third connection line TWL3 of the first color pixel PX-R.

Figure 12B:
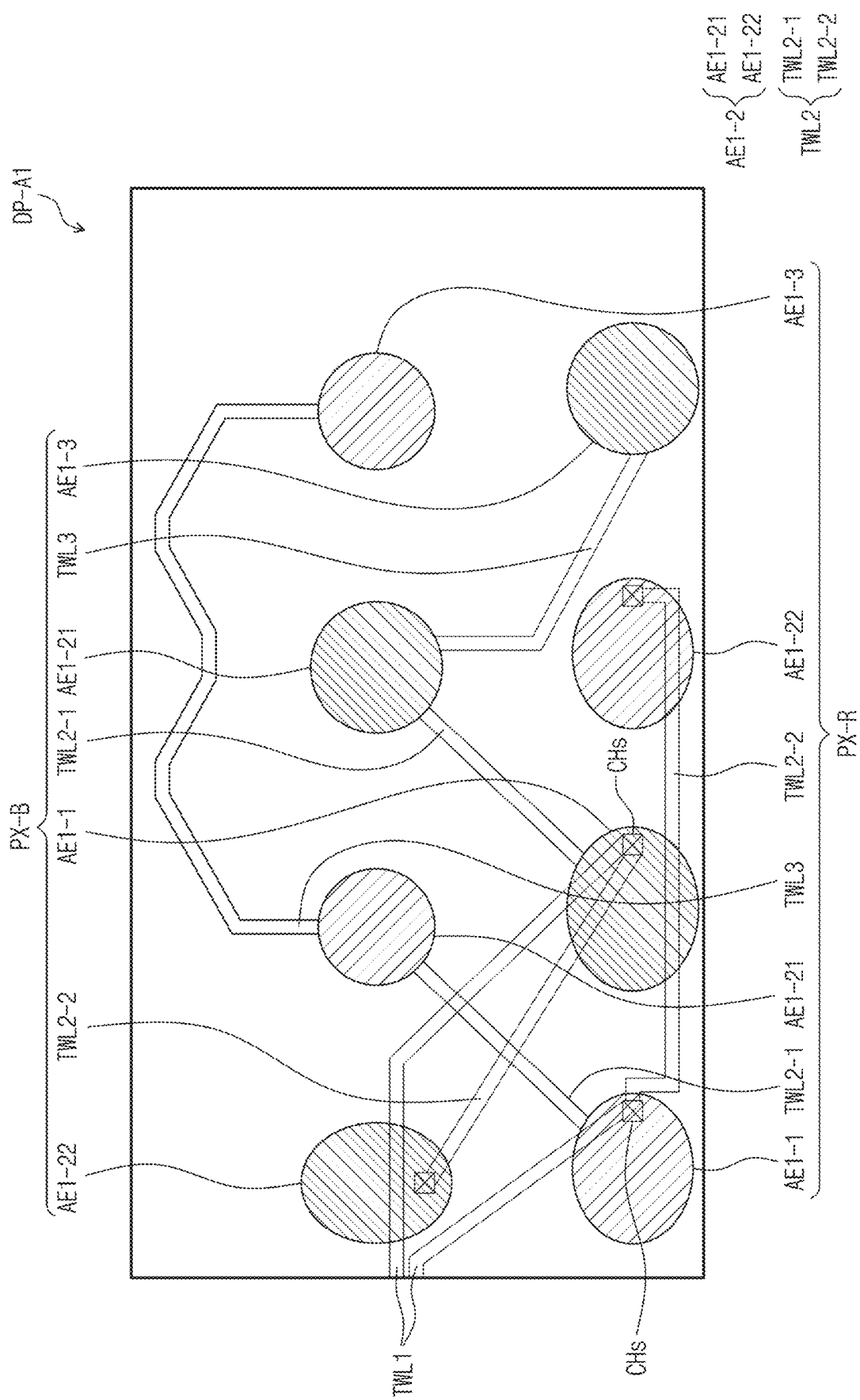
FIG. 12B is a plan view showing a first area according to another embodiment of the present disclosure.

FIG. 12B shows a first pixel PX1 that is different from the first pixel PX1 shown in FIG. 12A in detail. In FIG. 12A, descriptions will be focused on different features from the first pixel PX1 shown in FIG. 12A. In FIG. 12B, the second color pixel PX-G is not shown since the second color pixel PX-G has the same arrangement as that of FIG. 12A.

According to an embodiment, the first color pixel PX-R and the third color pixel PX-B may include plural second light emitting elements LD1-2 described with reference to FIG. 6A. Referring to the first color pixel PX-R and the third color pixel PX-B, two types of the second pixel electrodes AE1-2 are shown in FIG. 12B. Each of the two types of second pixel electrodes AE1-2 may be connected to the first pixel electrode AE1-1 through the second connection line TWL2. Two types of second connection lines TWL2 disposed on different layers from each other are shown.

A first-second pixel electrode AE1-21 may be connected to the first pixel electrode AE1-1 through one second connection line TWL2-1. The second-second pixel electrode AE1-22 may be connected to the first pixel electrode AE1-1 through the other second connection line TWL2-2.

The one second connection line TWL2-1 may be disposed on the same layer as the first pixel electrode AE1-1 and the first-second pixel electrode AE1-21. The one second connection line TWL2-1 may include the transparent conductive material as does the first connection line TWL1. The one second connection line TWL2-1 may overlap the first pixel electrode AE1-1 and the first-second pixel electrode AE1-21.

The other second connection line TWL2-2 may be disposed on a layer different from a layer on which the first connection line TWL1 connected to the first pixel electrode AE1-1 is disposed. When the first connection line TWL1 connected to the first pixel electrode AE1-1 is the connection line TWL shown in FIG. 8, the other second connection line TWL2-2 may be disposed between the sixth insulating layer 60 and the seventh insulating layer 70 of FIG. 8 or between the seventh insulating layer 70 and the eighth insulating layer 80 of FIG. 8.

Figure 13A:
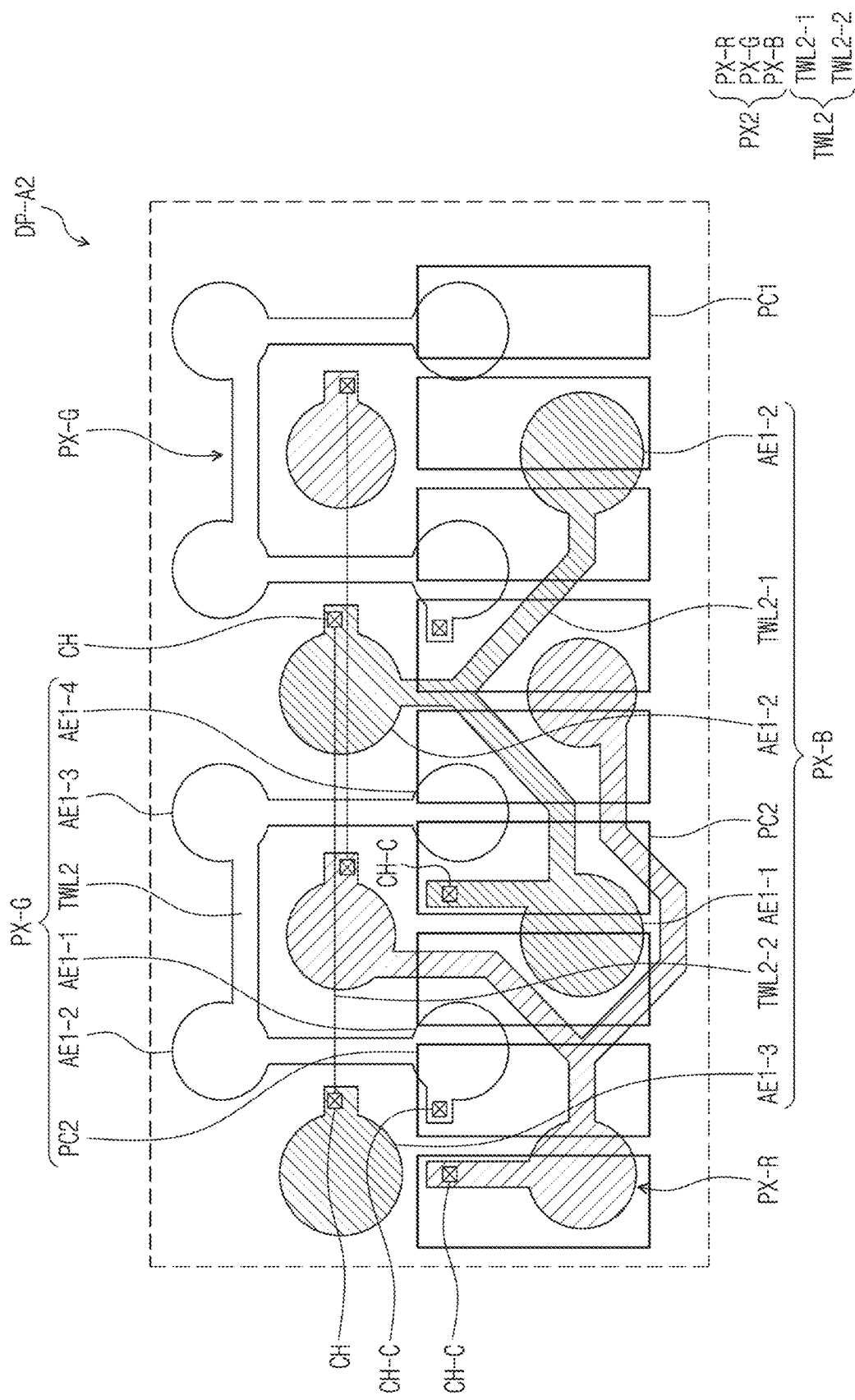
FIG. 13A is a plan view showing a second area according to an embodiment of the present disclosure.
Figure 13B:
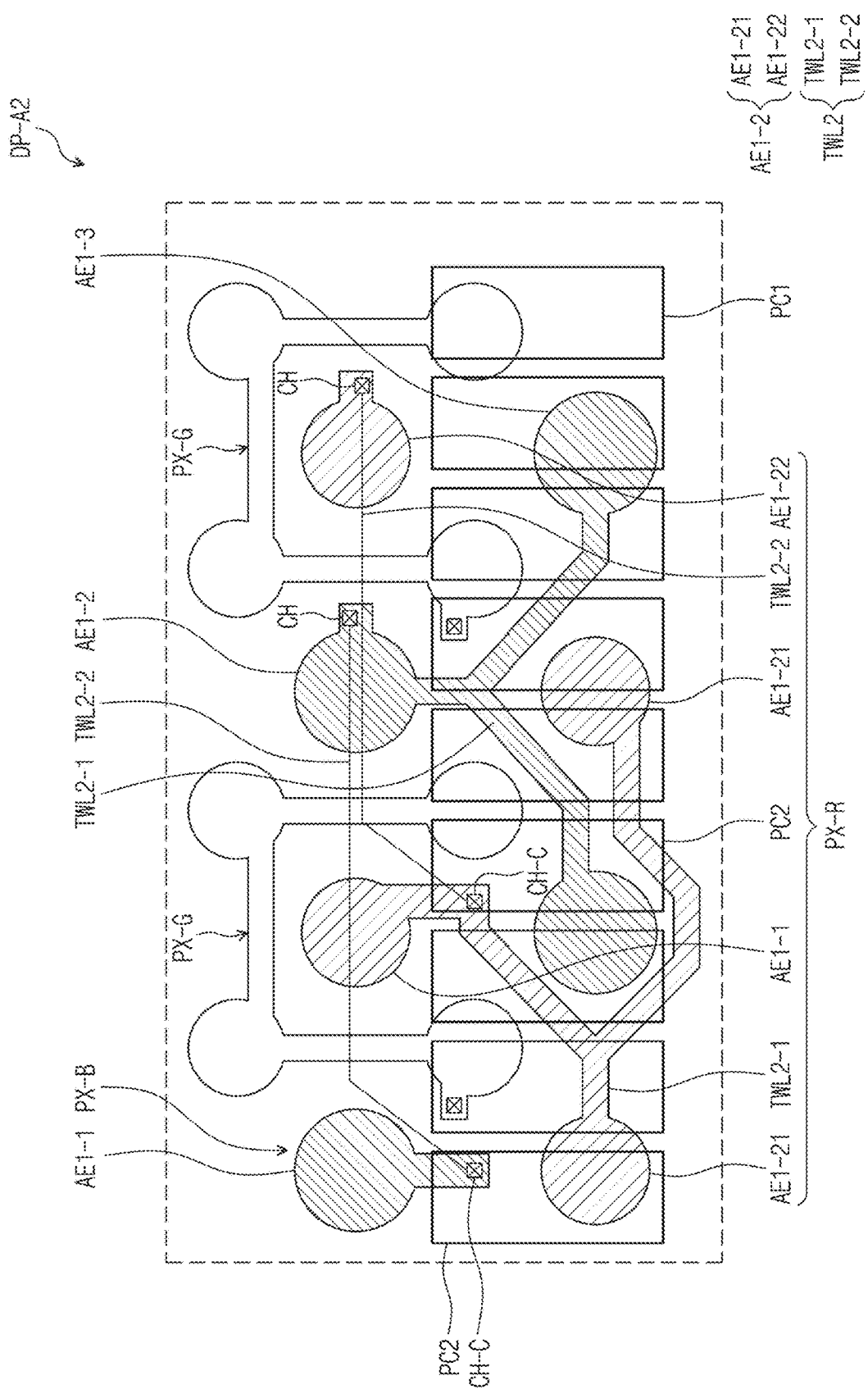
FIG. 13B is a plan view showing a second area according to another embodiment of the present disclosure.

FIG. 13A is a plan view showing a second area DP-A2 according to an embodiment of the present disclosure. FIG. 13B is a plan view showing a second area DP-A2 according to another embodiment of the present disclosure.

FIG. 13A shows the second pixel PX2 described with reference to FIGS. 5 to 9 in detail. The second pixel PX2 may include the first color pixel PX-R, the second color pixel PX-G, and the third color pixel PX-B. In the present embodiment, the first color pixel PX-R may be the red pixel, the second color pixel PX-G may be the green pixel, and the third color pixel PX-B may be the blue pixel.

FIG. 13A shows one first color pixel PX-R, two second color pixels PX-G, and one third color pixel PX-B. Each of the first color pixel PX-R, the second color pixel PX-G, and the third color pixel PX-B may include two or more light emitting elements connected to each other in parallel. As a representative example of the light emitting elements, the pixel electrodes AE1-1, AE1-2, AE1-3, and AE1-4 are shown. The light emitting layer EL1 and the second electrode CE shown in FIG. 8 may be disposed on the pixel electrodes AE1-1, AE1-2, AE1-3, and AE1-4.

The second color pixel PX-G may include the first pixel electrode AE1-1, the second pixel electrode AE1-2, the third pixel electrode AE1-3, and the fourth pixel electrode AE1-4. The first pixel electrode AE1-1 may be connected to the second pixel circuit PC2 via a contact hole CH-C. A connection relation between the first pixel electrode AE1-1 and the second pixel circuit PC2 may correspond to a connection relation between the first electrode AE1 and the silicon thin film transistor S-TFT shown in FIG. 7 or a connection relation between the second electrode AE2 and the second pixel circuit PC2 shown in FIG. 8. FIG. 13A further shows five first pixel circuits PC1.

The first pixel electrode AE1-1 may include an electrode portion that serves as an electrode and has a circular shape and a connection portion extending from the electrode portion. The connection portion may overlap the contact hole CH-C.

The second pixel electrode AE1-2 may be electrically connected to the first pixel electrode AE1-1 via the connection line TWL2, the third pixel electrode AE1-3 may be electrically connected to the second pixel electrode AE1-2 via the connection line TWL2, and the fourth pixel electrode AE1-4 may be electrically connected to the third pixel electrode AE1-3 via the connection line TWL2. The first pixel electrode AE1-1, the second pixel electrode AE1-2, the third pixel electrode AE1-3, the fourth pixel electrode AE1-4, and the connection line TWL2 may be formed through the same process, may have the same stack structure, and may be disposed on the same insulating layer.

Although not shown in figures, the light blocking pattern overlapping the connection line TWL2 may be disposed on the connection line TWL2 to prevent the external light from being reflected by the connection line TWL2. The light blocking pattern may be the pixel definition layer PDL described with reference to FIGS. 7 and 8.

According to an embodiment, the connection line TWL2 may include the transparent conductive material as does the first connection line TWL1 described with reference to FIG. 12A. Either one of the second pixel electrode AE1-2 and the connection line TWL2 may be formed on the eighth insulating layer 80 (refer to FIG. 8), and then the other one may be continuously formed. Different from the embodiment shown in FIG. 13A, the connection line TWL2 may overlap the second pixel electrode AE1-2.

The first color pixel PX-R and the third color pixel PX-B may have substantially the same configurations, and thus, descriptions of the third color pixel PX-B will be omitted. In addition, details on the same configurations or features of the second color pixel PX-G described above may also be applied to the second color pixel PX-G shown in FIG. 13A, and thus, descriptions thereof will be omitted.

The third color pixel PX-B may include the first pixel electrode AE1-1, the second pixel electrode AE1-2, and the third pixel electrode AE1-3. The third color pixel PX-B may include two second pixel electrodes AE1-2. The first pixel electrode AE1-1 may be connected to the second pixel circuit PC2 via the contact hole CH-C.

The two second pixel electrodes AE1-2 may be electrically connected to the first pixel electrode AE1-1 via a first type connection line TWL2-1. The first pixel electrode AE1-1, the two second pixel electrodes AE1-2, and the first type connection line TWL2-1 may be formed through the same process, may have substantially the same stack structure, and may be disposed on the same insulating layer.

A first-second pixel electrode AE1-2 among the two second pixel electrodes AE1-2 may be electrically connected to the third pixel electrode AE1-3 via a second type connection line TWL2-2. The second type connection line TWL2-2 may be formed through the same process as the gate GT2 of the oxide thin film transistor O-TFT shown in FIG. 7, may have substantially the same stack structure, and may be disposed on the same insulating layer, however, the invention should not be limited thereto or thereby. According to another embodiment, the second type connection line TWL2-2 may be formed by the conductive pattern disposed on a layer different from a layer on which the second type connection line TWL2-2 is disposed.

Each of the second pixel electrode AE1-2 and the third pixel electrode AE1-3, which are connected via the second type connection line TWL2-2, may include an electrode portion that substantially serves as an electrode portion and having a circular shape and a connection portion extending from the electrode portion. The connection portion may overlap the contact hole CH.

The conductive pattern disposed on a layer different from the first connection line TWL1 described with reference to FIGS. 12A and 12B may be applied to the connection line TWL2 of the second area DP-A2. Accordingly, the first connection line TWL1 extending to the first area DP-A1 from the second area DP-A2 and the connection line TWL2 may be effectively prevented from being short circuited in the second area DP-A2.

Referring to FIG. 13B, the second pixel PX2 may include one first color pixel PX-R, two second color pixels PX-G, and one third color pixel PX-B. Details on the same configurations or features of the second color pixel PX-G described with reference to FIG. 13A will be omitted.

The first color pixel PX-R may include the first pixel electrode AE1-1 and the second pixel electrode AE1-2. The first color pixel PX-R may include two types of second pixel electrodes AE1-21 and AE1-22. The first-second pixel electrode AE1-21 may be connected to the first pixel electrode AE1-1 via the first type connection line TWL2-1. A second-second pixel electrode AE1-22 may be connected to the first pixel electrode AE1-1 via the second type connection line TWL2-2.

The third color pixel PX-B may include the first pixel electrode AE1-1, the second pixel electrode AE1-2, and the third pixel electrode AE1-3. The third color pixel PX-B may include two third pixel electrodes AE1-3. The first pixel electrode AE1-1 and the second pixel electrode AE1-2 may be electrically connected to each other via the second type connection line TWL2-2. The two third pixel electrodes AE1-3 may be electrically connected to the second pixel electrode AE1-2 via the first type connection line TWL2-1.

The contact hole CH-C shown in FIG. 13B may be similar to the contact hole CHs shown in FIG. 12B. The first pixel electrode AE1-1 may be connected to the second type connection line TWL2-2 disposed thereunder, and the second type connection line TWL2-2 may be connected to the drain area DE1 of the silicon thin film transistor S-TFT (refer to FIG. 7) disposed thereunder.

Figure 14A:
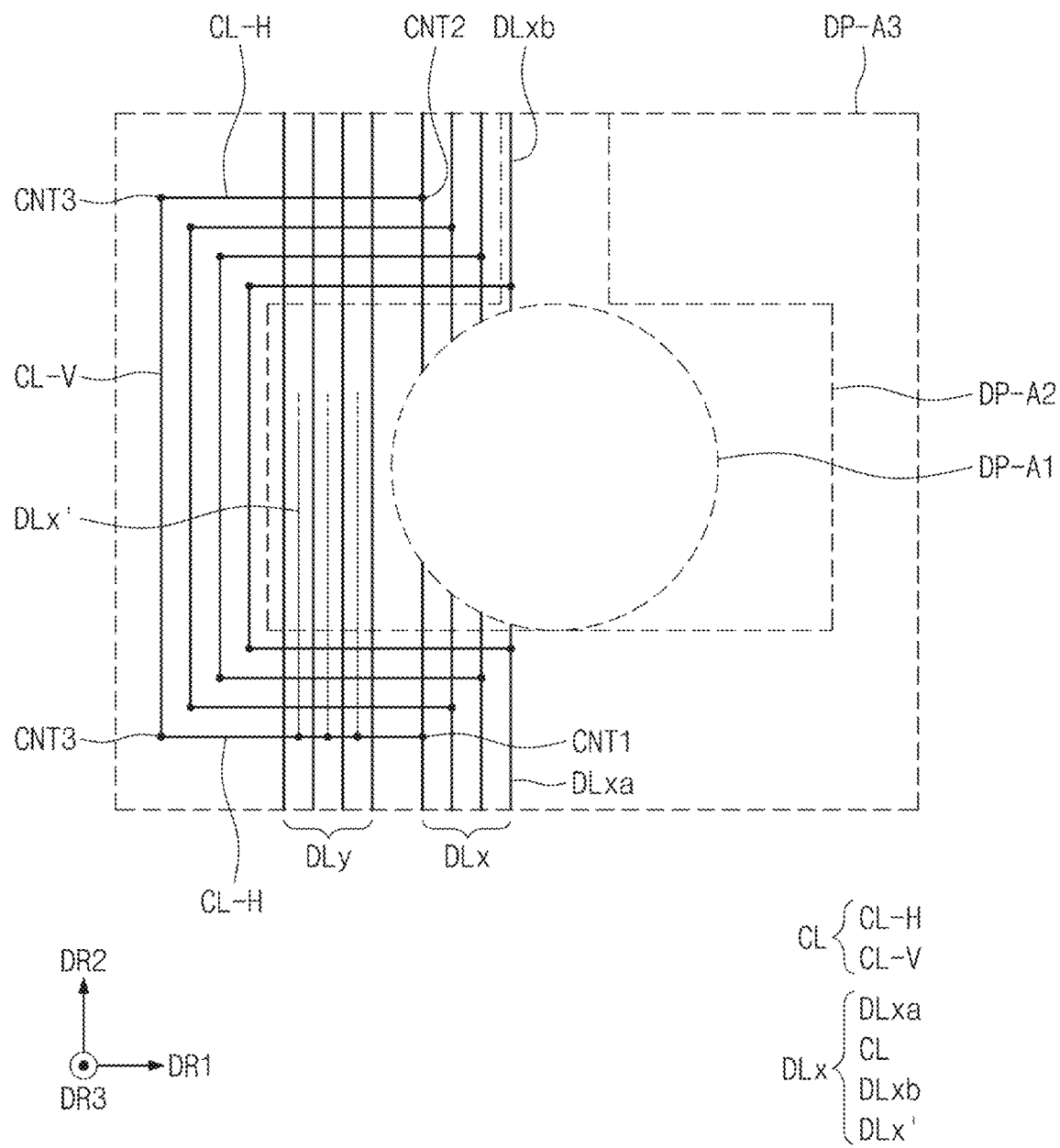
FIG. 14A is an enlarged plan view showing a portion of a display panel according to an embodiment of the present disclosure.
Figure 14B:
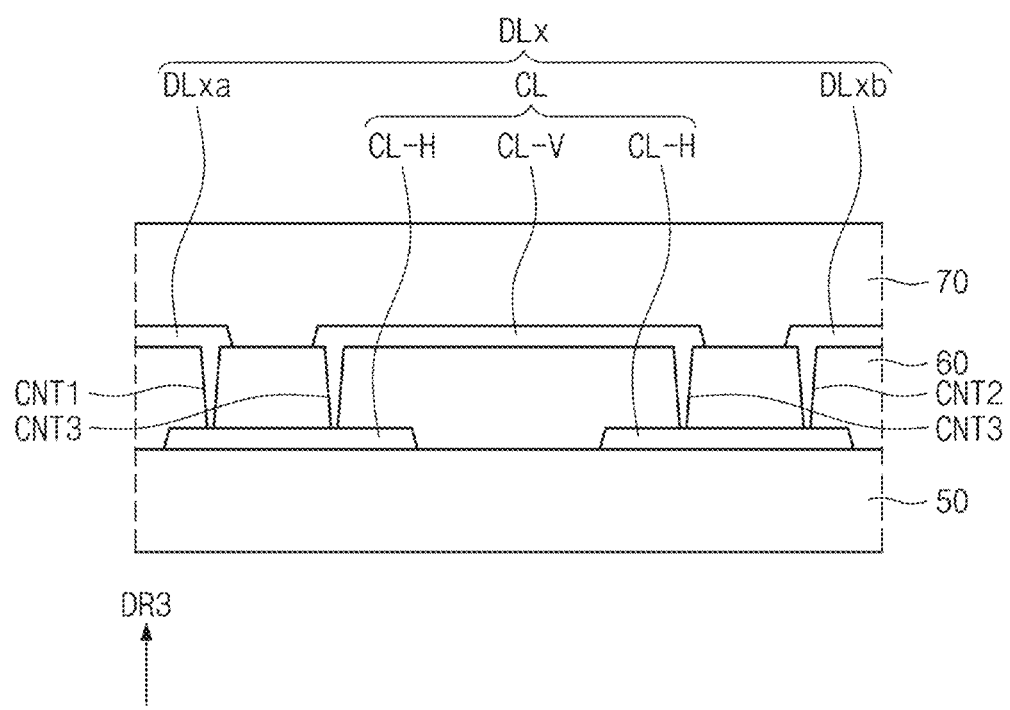
FIG. 14B is a cross-sectional view showing a first data line shown in FIG. 14A.

FIG. 14A is an enlarged plan view showing a portion of the display panel according to an embodiment of the present disclosure. FIG. 14B is a cross-sectional view showing a first data line shown in FIG. 14A.

Hereinafter, a plurality of data lines DLx and DLy will be described with reference to FIGS. 5, 14A, and 14B. The data lines DLx and DLy may include first data lines DLx and second data lines DLy, which extend in the second direction DR2.

The first data lines DLx may bypass the first area DP-A1 not to overlap the first area DP-A1. Accordingly, the transmittance of the first area DP-A1 may increase. Each of the first data lines DLx may include a first portion DLxa, a second portion DLxb, and a connection portion CL. The first portion DLxa and the second portion DLxb may be spaced apart from each other with the first area DP-A1 interposed therebetween. Each of the first portion DLxa and the second portion DLxb may extend in the second direction DR2, and the first portion DLxa and the second portion DLxb may be spaced apart from each other in the second direction DR2.

The connection portion CL may be electrically connected to the first portion DLxa and the second portion DLxb. The connection portion CL may transmit a data signal applied thereto through the first portion DLxa to the second portion DLxb. One end of the connection portion CL may be connected to the first portion DLxa via a first contact hole CNT1, and the other end of the connection portion CL may be connected to the second portion DLxb via a second contact hole CNT2.

The connection portion CL may include a first transmission line CL-H extending in the first direction DR1 and a second transmission line CL-V extending in the second direction DR2. The first transmission line CL-H may be disposed on a layer different from the first portion DLxa and the second portion DLxb. The first transmission line CL-H and the second transmission line CL-V may be disposed on different layers from each other. The first transmission line CL-H and the second transmission line CL-V may be connected to each other via a third contact hole CNT3.

Each of the first data lines DLx may include a data transmission line DLx'. The data transmission line DLx' may extend from the connection portion CL to apply the data signal to the first pixel circuit PC1 disposed in the second area DP-A2. The connection portion CL and the data transmission line DLx' may be disposed on different layers from each other. The data transmission line DLx' may extend in the second direction DR2 and may be connected to the first transmission line CL-H. Accordingly, the data signal provided through the first portion DLxa may be applied to the data transmission line DLx'.

The first transmission line CL-H may be disposed between the fifth insulating layer 50 and the sixth insulating layer 60, and the second transmission line CL-V, the first portion DLxa, and the second portion DLxb may be disposed between the sixth insulating layer 60 and the seventh insulating layer 70. Positions of the fifth insulating layer 50 and the sixth insulating layer 60 in the stack structure of the display device DD are the same as shown in FIGS. 7 and 8.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:
1. A display device comprising:
a display panel comprising a base layer comprising a first area, a second area adjacent to the first area, and a third area adjacent to the second area, a connection line disposed on the base layer, and first, second, and third pixels disposed on the base layer, the first pixel comprising:
- a first light emitting element of a first group comprising a first pixel electrode disposed in the first area;
- a second light emitting element of the first group comprising a second pixel electrode disposed in the first area; and
- a first pixel circuit electrically connected to the first light emitting element of the first group and the second light emitting element of the first group and disposed in the second area, the second pixel comprising:
- a light emitting element of a second group comprising a pixel electrode disposed in the second area; and
- a second pixel circuit electrically connected to the light emitting element of the second group and disposed in the second area, the third pixel comprising:
- a light emitting element of a third group comprising a pixel electrode disposed in the third area; and
- a third pixel circuit electrically connected to the light emitting element of the third group and disposed in the third area, the connection line comprising:
- a first connection line which electrically connects the first pixel electrode and the first pixel circuit; and
- a second connection line which electrically connects the first pixel electrode and the second pixel electrode, wherein the display panel further includes ring patterns overlapping outer edges of the first pixel electrode and the second pixel electrode, respectively and spaced apart from each other in a plan view, the first pixel comprises a first color pixel and a second color pixel, which generate lights having different colors from each other, and the second connection line which electrically connects the first pixel electrode and the second pixel electrode of the first color pixel crosses the second connection line which electrically connects the first pixel electrode and the second pixel electrode of the second color pixel, and is disposed in a layer different from a layer in which the second connection line which electrically connects the first pixel electrode and the second pixel electrode of the second color pixel is disposed.

2. The display device of claim 1, wherein the second light emitting element of the first group is provided in plural, and the first pixel comprises the plurality of second light emitting elements of the first group.

3. The display device of claim 1, wherein the first pixel further comprises a third light emitting element of the first group, and the third light emitting element of the first group comprises a third pixel electrode electrically connected to the second pixel electrode and disposed in the first area.

4. The display device of claim 1, wherein each of the first connection line and the second connection line comprises a transparent conductive oxide.

5. The display device of claim 1, wherein the first pixel further comprises a third light emitting element of the first group, the third light emitting element of the first group comprises a third pixel electrode disposed in the first area, the display panel further comprises a third connection line which electrically connects the second pixel electrode and the third pixel electrode, and the third connection line comprises a transparent conductive oxide.

6. The display device of claim 5, wherein the third connection line and the second pixel electrode are disposed on a first insulating layer, and the second connection line is connected to the second pixel electrode via a contact hole defined through the first insulating layer.

7. The display device of claim 6, wherein the third pixel electrode has an area smaller than an area of the second pixel electrode in the plan view.

8. The display device of claim 1, wherein an edge of each of the first pixel electrode and the second pixel electrode comprises a curve.

9. The display device of claim 8, wherein the first pixel electrode has an area greater than an area of the second pixel electrode in the plan view.

10. The display device of claim 1, wherein the second connection line and the first pixel electrode are disposed on a same insulating layer.

11. The display device of claim 1, wherein the first pixel electrode has an oval shape, and the second pixel electrode has a circular shape.

12. The display device of claim 1, further comprising color filters overlapping the first pixel electrode, the second pixel electrode, the pixel electrode of the light emitting element of the second group, and the pixel electrode of the light emitting element of the third group, respectively, wherein the color filters are disposed on the display panel.

13. The display device of claim 1, further comprising an input sensor comprising a sensing electrode overlapping at least the third area, wherein the input sensor is disposed on the display panel.

14. The display device of claim 1, wherein the first area comprises a transmission area through which an optical signal provided from or applied to an electronic module transmits and an element area overlapping the first pixel electrode.

15. The display device of claim 1, wherein the pixel electrode of the light emitting element of the third group has an area smaller than an area of each of the first pixel electrode and the second pixel electrode and has an area smaller than the pixel electrode of the light emitting element of the second group.

16. The display device of claim 1, wherein number of the pixel electrodes of the light emitting element of the third group disposed in a unit area is greater than number of the pixel electrodes of the light emitting element of the second group disposed in the unit area.

17. A display device comprising:
a display panel comprising a base layer comprising a first area, a second area adjacent to the first area, and a third area adjacent to the second area and first, second, and third pixels disposed on the base layer, the first pixel comprising:
- a first light emitting element of a first group comprising a first pixel electrode disposed in the first area;
- a second light emitting element of the first group comprising a second pixel electrode electrically connected to the first pixel electrode and disposed in the first area; and
- a first pixel circuit electrically connected to the first light emitting element of the first group and the second light emitting element of the first group and disposed in the second area, the second pixel comprising:
- a light emitting element of a second group comprising a pixel electrode disposed in the second area; and a second pixel circuit electrically connected to the light emitting element of the second group and disposed in the second area, the third pixel comprising:
  a light emitting element of a third group comprising a pixel electrode disposed in the third area; and
  a third pixel circuit electrically connected to the light emitting element of the third group and disposed in the third area, wherein the first pixel electrode has an area greater than an area of the second pixel electrode in a plan view, and the first pixel electrode comprises a first outer edge having a curved shape and a first inner edge having a curved shape in the plan view, wherein the first inner edge defines a through-hole penetrating the first pixel electrode from a top surface to a bottom surface of the first pixel electrode.

18. The display device of claim 17, wherein the display panel further comprises:
  a ring pattern overlapping the first outer edge in the plan view; and
  a dummy pattern overlapping the opening and the first inner edge in the plan view.

19. The display device of claim 18, wherein each of the ring pattern and the dummy pattern comprises a black coloring agent.

20. The display device of claim 17, wherein the display panel further comprises a pixel definition layer, and the pixel definition layer is provided with a first opening and a second opening, which are defined therethrough to expose the pixel electrode of the light emitting element of the second group and the pixel electrode of the light emitting element of the third group, respectively.

21. The display device of claim 20, wherein the pixel electrode of the light emitting element of the second group comprises a second outer edge having a curved shape and a second inner edge having a curved shape to define the first opening.

22. The display device of claim 21, wherein the display panel further comprises a dummy pattern overlapping the first opening and the second inner edge in the plan view.

23. The display device of claim 17, wherein the first pixel electrode has an oval shape, and the second pixel electrode has a circular shape.

24. The display device of claim 23, wherein each of the pixel electrode of the light emitting element of the second group and the pixel electrode of the light emitting element of the third group has a circular shape.

25. A display device comprising:
  a display panel comprising a base layer comprising a first area, a second area adjacent to the first area, and a third area adjacent to the second area and first, second, and third pixels disposed on the base layer,
  the first pixel comprising:
    a light emitting element of a first group comprising a pixel electrode disposed in the first area; and
    a first pixel circuit electrically connected to the light emitting element of the first group and disposed in the second area,
  the second pixel comprising:
    a first light emitting element of a second group comprising a first pixel electrode disposed in the second area;
    a second light emitting element of the second group comprising a second pixel electrode electrically connected to the first pixel electrode and disposed in the second area; and
    a second pixel circuit electrically connected to the first light emitting element of the second group and the second light emitting element of the second group and disposed in the second area,
  the third pixel comprising:
    a light emitting element of a third group comprising a pixel electrode disposed in the third area; and
    a third pixel circuit electrically connected to the light emitting element of the third group and disposed in the third area,
  wherein the display panel further comprises a pixel definition layer, and the pixel definition layer is provided with openings, which are defined therethrough to expose the first pixel electrode of the first light emitting element of the second group, the second pixel electrode of the second light emitting element of the second group, and the pixel electrode of the light emitting element of the third group, respectively.

26. The display device of claim 25, wherein the second light emitting element of the second group is provided in plural, and the second pixel comprises the plurality of second light emitting elements of the second group.

27. The display device of claim 25, wherein the display panel further comprises a connection line which electrically connects the first pixel electrode and the second pixel electrode, and the connection line and the first pixel electrode are disposed in a same insulating layer.

28. The display device of claim 27, wherein the connection line is provided integrally with the first pixel electrode and comprises a same material as the first pixel electrode.

29. The display device of claim 25, wherein the display panel further comprises a connection line which electrically connects the first pixel electrode and the second pixel electrode, and the connection line and the first pixel electrode are disposed in different layers from each other.

30. The display device of claim 25, wherein the second pixel further comprises a third light emitting element of the second group, and the third light emitting element of the second group comprises a third pixel electrode electrically connected to the second pixel electrode and disposed in the second area.

31. The display device of claim 30, wherein the display panel further comprises:
  a first connection line which electrically connects the first pixel electrode and the second pixel electrode; and
  a second connection line which electrically connects the second pixel electrode and the third pixel electrode,
  wherein each of the first connection line and the second connection line is disposed in a same layer as the first pixel electrode.

32. The display device of claim 31, wherein the first connection line is provided integrally with the first pixel electrode and comprises a same material as the first pixel electrode.

33. The display device of claim 25, wherein the second pixel further comprises a third light emitting element of the second group, and the third light emitting element of the second group comprises a third pixel electrode connected to the first pixel electrode or the second pixel electrode via a connection line and disposed in the second area.

34. The display device of claim 33, wherein the connection line and the first pixel electrode are disposed directly on different insulating layers from each other.

35. The display device of claim 33, wherein the second pixel electrode has substantially the same area as the third pixel electrode in a plan view.

* * * * *